United States Patent
Okamoto et al.

(10) Patent No.: US 9,422,150 B2
(45) Date of Patent: Aug. 23, 2016

(54) PRESSURE SENSOR

(71) Applicant: Kabushiki Kaisha Toshiba, Minato-ku (JP)

(72) Inventors: Kazuaki Okamoto, Fuchu (JP); Hideaki Fukuzawa, Kawasaki (JP); Yoshihiko Fuji, Kawasaki (JP); Akiko Yuzawa, Kawasaki (JP); Akio Hori, Kawasaki (JP); Kei Masunishi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 77 days.

(21) Appl. No.: 14/584,625

(22) Filed: Dec. 29, 2014

(65) Prior Publication Data

US 2015/0266717 A1 Sep. 24, 2015

(30) Foreign Application Priority Data

Mar. 20, 2014 (JP) ................. 2014-058312

(51) Int. Cl.
*B81B 3/00* (2006.01)
*H01L 41/12* (2006.01)
(Continued)

(52) U.S. Cl.
CPC ............ *B81B 3/0051* (2013.01); *B81B 3/0091* (2013.01); *G01L 1/12* (2013.01);
(Continued)

(58) Field of Classification Search
CPC ............ G01L 1/12; G01L 1/125; G01L 9/16; G01L 7/08; G01L 7/00; G01L 7/082; B81B 3/00; B81B 3/0051; B81B 3/0018; B81B 3/0097; B81B 3/0091; B81B 3/0072; B81B 3/004; B81B 2201/0264; H01L 41/12; H01L 41/125

See application file for complete search history.

(56) References Cited

U.S. PATENT DOCUMENTS 8,760,154 B2 * 6/2014 Giddings ................. G01B 7/24
324/209
8,958,574 B2 * 2/2015 Fukuzawa ............ G10L 9/0042
381/115

(Continued)

FOREIGN PATENT DOCUMENTS

JP          3-44079      2/1991
JP       2002-148132     5/2002

(Continued)

OTHER PUBLICATIONS

D. Meyners, et al., "Pressure sensor based on magnetic tunnel junctions", AIP Journal of Applied Physics, vol. 105, 07C914, 2009, 4 pgs.

(Continued)

*Primary Examiner* — Jose R Diaz
(74) *Attorney, Agent, or Firm* — Oblon, McClelland, Maier & Neustadt, L.L.P.

(57) ABSTRACT

According to one embodiment, a pressure sensor includes: a support section; a film section; and a strain sensing element. The film section is supported by the support section and deformable. The film section includes a first film and a second film. The first film includes a first region located in a central part and a second region located in a peripheral part around the first region. The second film is provided on the first region. The strain sensing element is provided on part of the second region. The strain sensing element includes a first magnetic layer; a second magnetic layer; and an intermediate layer. Magnetization of the first magnetic layer changes in response to deformation of the second region. The intermediate layer is provided between the first magnetic layer and the second magnetic layer.

20 Claims, 25 Drawing Sheets

(51) Int. Cl.
*G01L 1/12* (2006.01)
*G01L 9/16* (2006.01)
*G01L 17/00* (2006.01)

(52) U.S. Cl.
CPC .............. *G01L 9/16* (2013.01); *G01L 17/00* (2013.01); *H01L 41/12* (2013.01); *H01L 41/125* (2013.01); *B81B 2201/0257* (2013.01); *B81B 2201/0264* (2013.01)

(56) References Cited

U.S. PATENT DOCUMENTS

| | | | |
|---|---|---|---|
| 9,250,142 B2 * | 2/2016 | Fukuzawa | ............ B81B 3/0086 |
| 2008/0047354 A1 | 2/2008 | Otsuka et al. | |
| 2011/0295128 A1 | 12/2011 | Yuasa et al. | |
| 2012/0017691 A1 | 1/2012 | Ishihara et al. | |
| 2013/0255393 A1 | 10/2013 | Fukuzawa et al. | |

FOREIGN PATENT DOCUMENTS

| | | |
|---|---|---|
| JP | 2005-337774 | 12/2005 |
| JP | 2008-39760 | 2/2008 |
| JP | 2011-244938 | 12/2011 |
| JP | 5196662 | 5/2013 |
| JP | 2013-205403 | 10/2013 |

OTHER PUBLICATIONS

M. Lohndorf, et al., "Highly sensitive strain sensors based on magnetic tunneling junctions", AIP Applied Physics Letters, vol. 81, 313, 2002, 4 pgs.

* cited by examiner

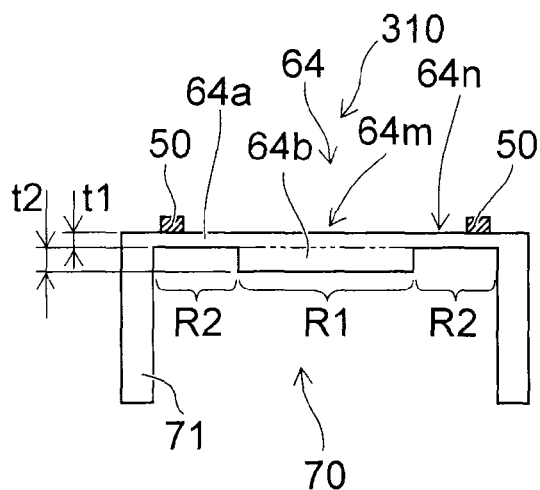
FIG. 2A
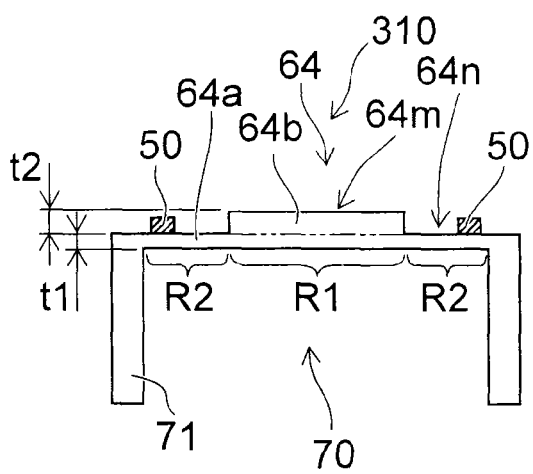
FIG. 2B
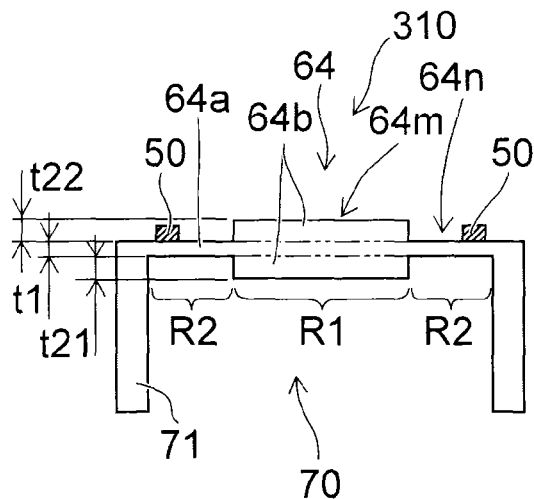
FIG. 2C
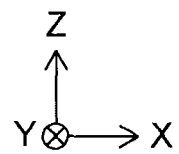

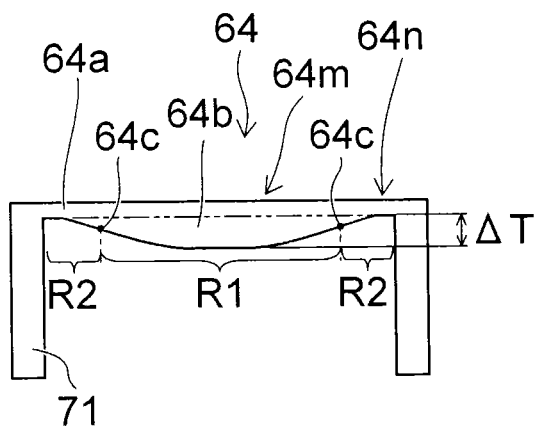
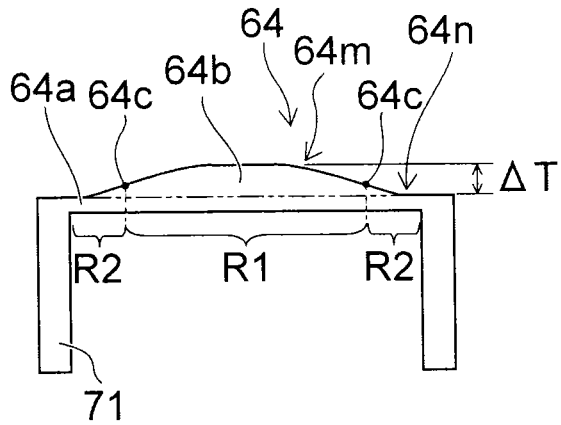
FIG. 4A
FIG. 4B
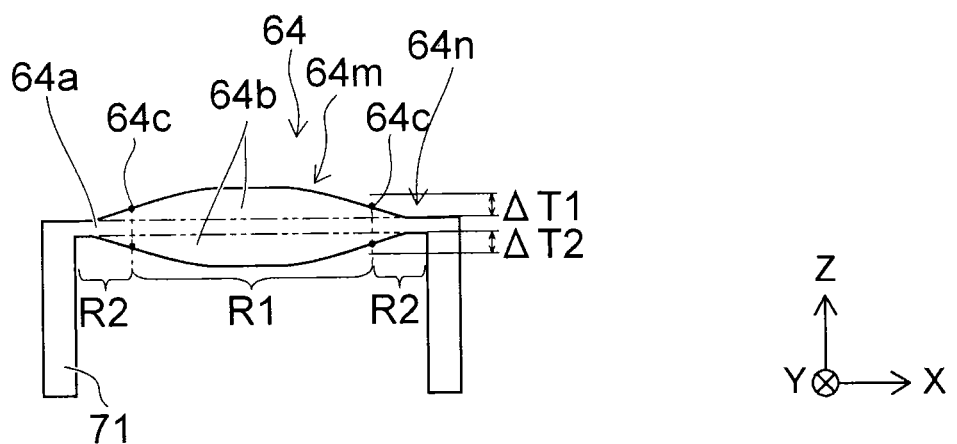
FIG. 4C

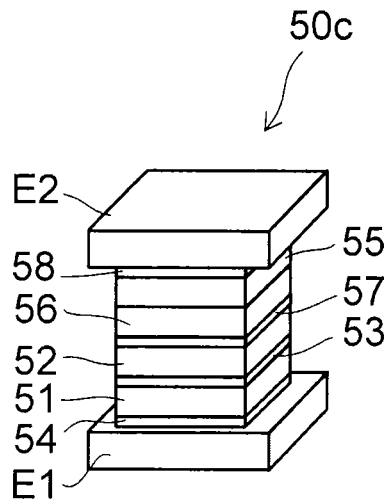
FIG. 9A
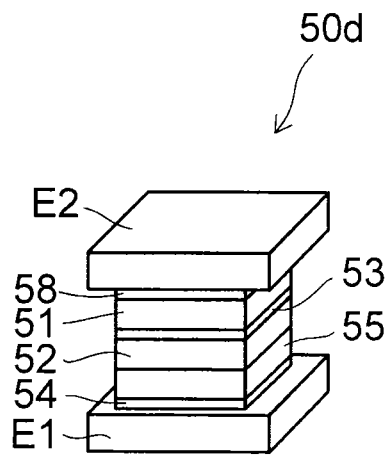
FIG. 9B
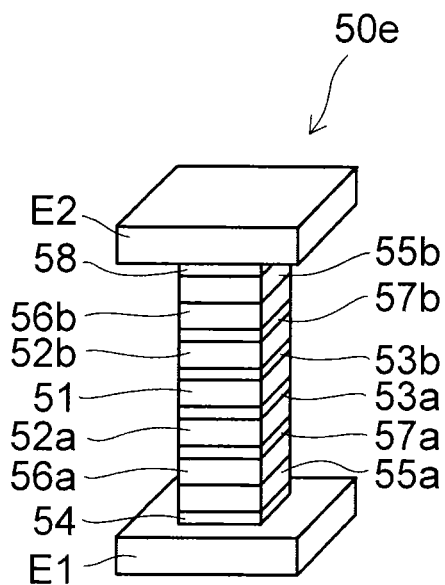
FIG. 9C
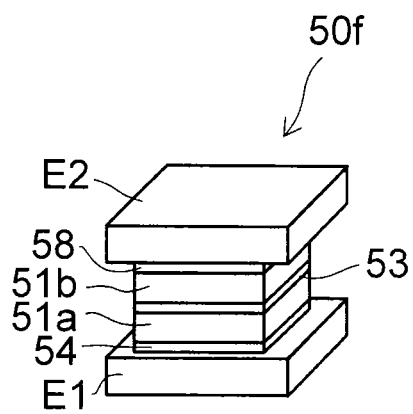
FIG. 9D
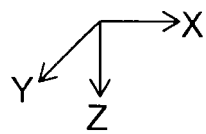

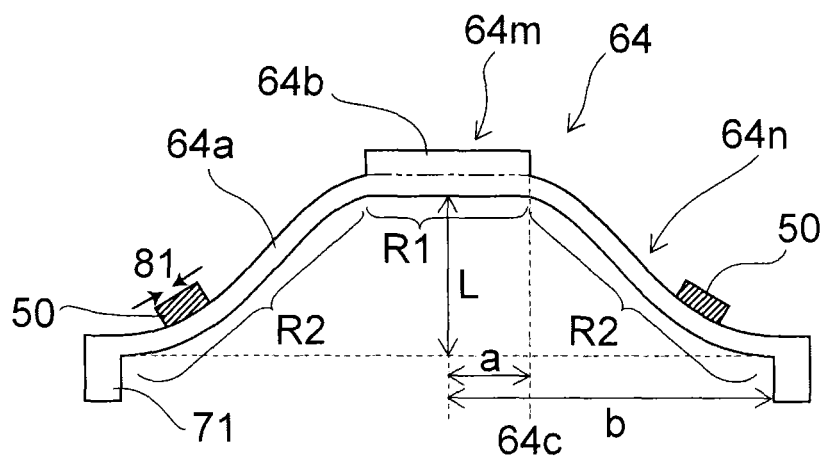
FIG. 11A
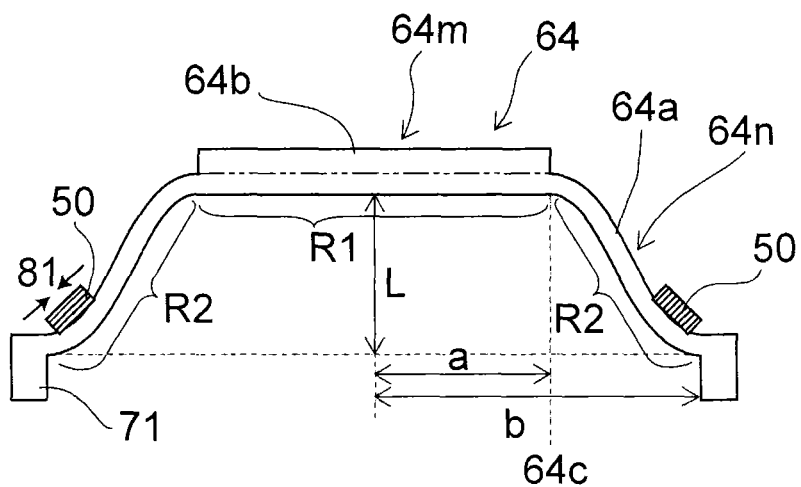
FIG. 11B
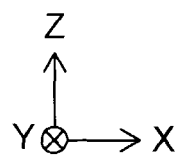

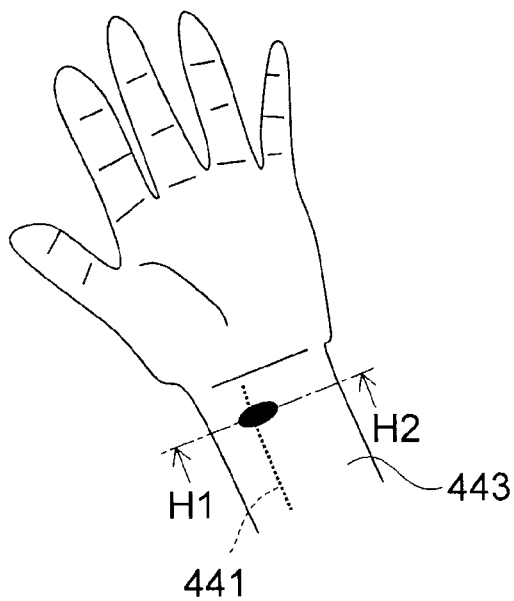
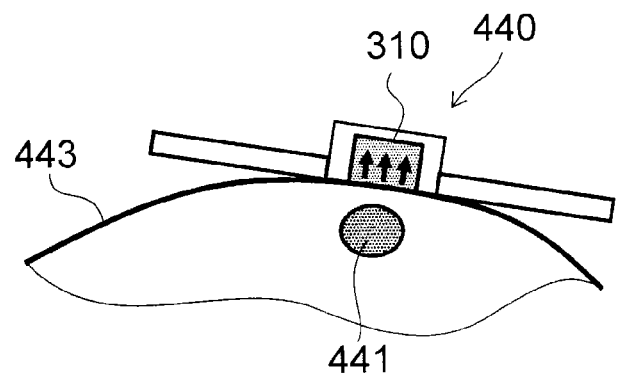
FIG. 33A
FIG. 33B
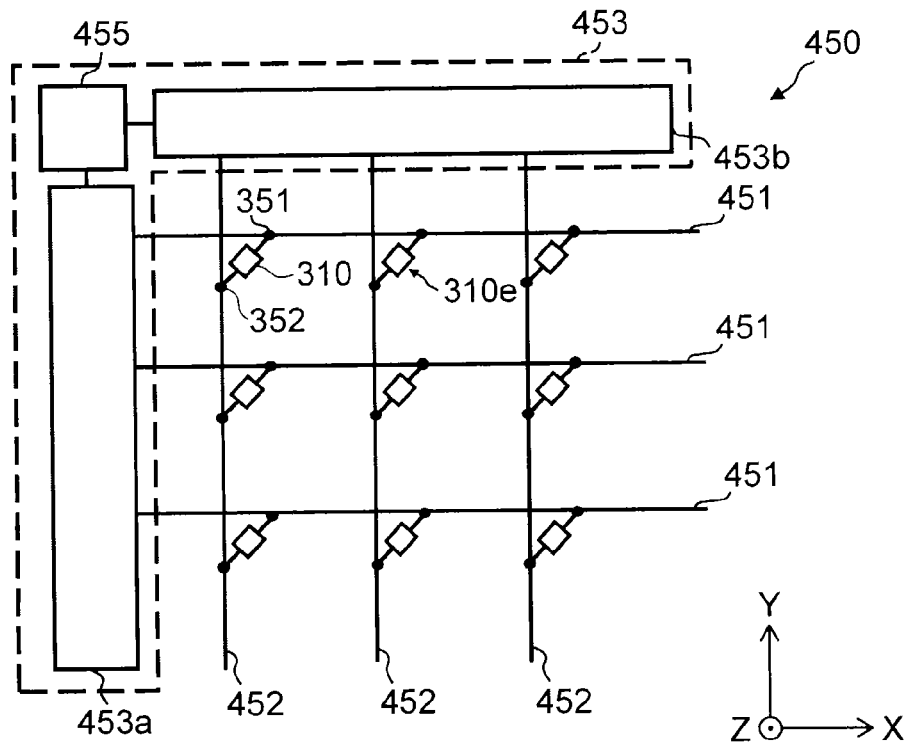
FIG. 34

PRESSURE SENSOR

CROSS-REFERENCE TO RELATED APPLICATIONS

This application is based upon and claims the benefit of priority from Japanese Patent Application No. 2014-058312, filed on Mar. 20, 2014; the entire contents of which are incorporated herein by reference.

FIELD

Embodiments described herein relate generally to a pressure sensor.

BACKGROUND

Pressure sensors using MEMS (microelectromechanical systems) technology include e.g. those of piezoresistance change type and of capacitance type. On the other hand, pressure sensors using spin technology have been proposed. The pressure sensor using spin technology senses resistance change depending on strain. For instance, improvement in sensitivity is desired in a strain sensing element used in e.g. pressure sensors using spin technology.

BRIEF DESCRIPTION OF THE DRAWINGS

FIGS. 2A to 2C are schematic sectional views illustrating the pressure sensor according to the first embodiment;

FIGS. 4A to 4C are schematic sectional views illustrating the shape of the film section according to the first embodiment;

FIGS. 9A to 9D are schematic perspective views illustrating alternative strain sensing elements that can be fabricated by the manufacturing method according to the first embodiment;

FIGS. 11A and 11B are schematic sectional views showing the displacement of the film section when the film section of the pressure sensor of the first embodiment is warped convexly to the outside;

FIGS. 33A and 33B are schematic views illustrating a blood pressure sensor according to a sixth embodiment; and FIG. 34 is a schematic plan view illustrating a touch panel according to a seventh embodiment.

DETAILED DESCRIPTION

Figure 1A:
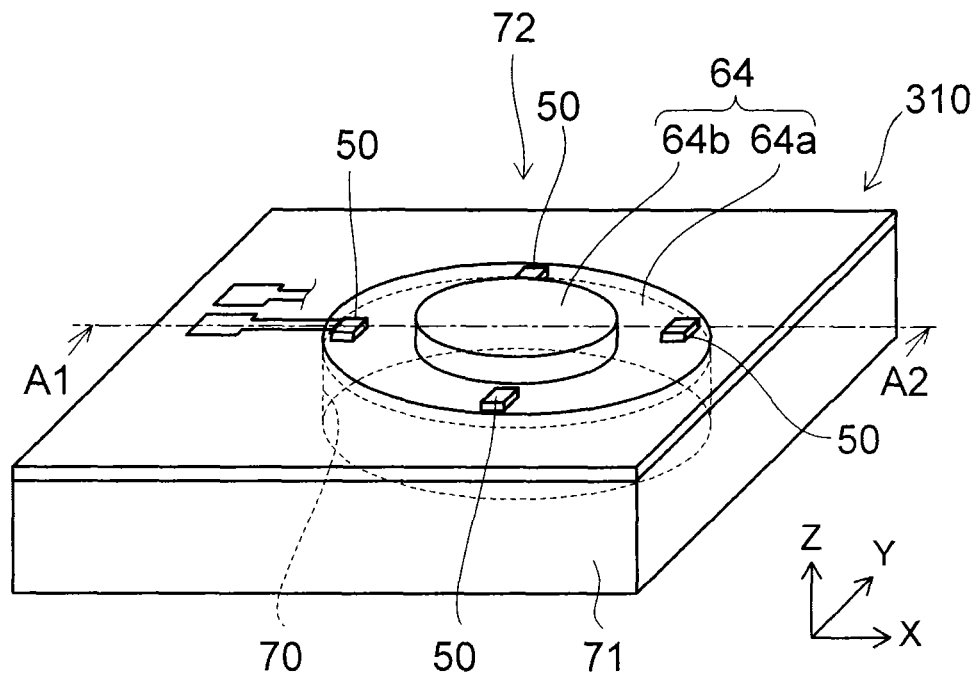
FIGS. 1A and 1B are schematic perspective views illustrating a pressure sensor and a strain sensing element according to a first embodiment.

In general, according to one embodiment, a pressure sensor includes: a support section; a film section; and a strain sensing element. The film section is supported by the support section and deformable. The film section includes a first film and a second film. The first film includes a first region located in a central part and a second region located in a peripheral part around the first region. The second film is provided on the first region. The strain sensing element is provided on part of the second region. The strain sensing element includes a first magnetic layer; a second magnetic layer; and an intermediate layer. Magnetization of the first magnetic layer changes in response to deformation of the second region. The intermediate layer is provided between the first magnetic layer and the second magnetic layer.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

First Embodiment

Figure 1B:
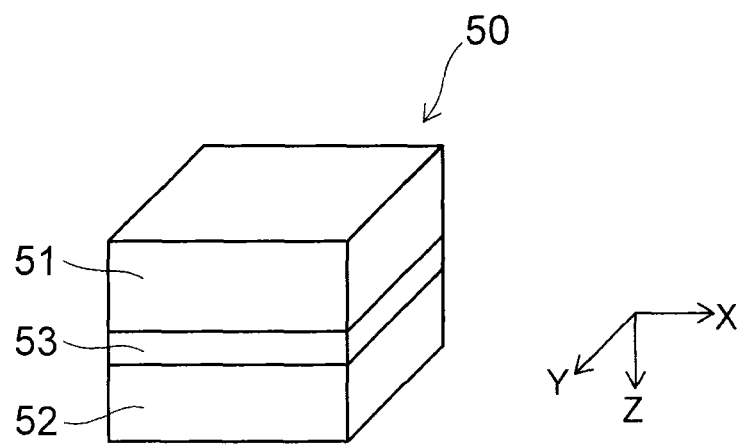

FIGS. 1A and 1B are schematic perspective views illustrating a pressure sensor and a strain sensing element according to a first embodiment.

FIG. 1A is a schematic perspective view illustrating the pressure sensor according to the embodiment. FIG. 1B is a schematic perspective view illustrating the strain sensing element according to the embodiment.

In FIG. 1A, for clarity of illustration, insulating portions are not shown, and conductive portions are primarily depicted. In FIG. 1B, for clarity of illustration, one of the strain sensing elements 50 is depicted. Furthermore, as described later, the thickness of the central part 64m (see FIGS. 2A to 2C) of the film section 64 is different from the thickness of the peripheral part 64n (see FIGS. 2A to 2C) of the film section 64.

As shown in FIG. 1A, the pressure sensor 310 includes a support section 71 and a sensor section 72. The sensor section 72 is provided on the support section 71. The sensor section 72 includes a film section 64 and a strain sensing element 50.

As shown in FIG. 1A, the strain sensing elements 50 may be placed in a plurality on the film section 64.

The film section 64 is a deformable film supported by the support section 71. The film section 64 includes a first film 64a and a second film 64b. The first film 64a includes a first region R1 (see FIGS. 2A to 2C) and a second region R2 (see FIGS. 2A to 2C). The first region R1 is located in a central part 64m of the film section 64. The second region R2 is located in a peripheral part 64n of the film section 64 (peripheral part around the first region R1). The second film 64b is provided on the first region R1. The film section 64 is flexible, i.e., can be warped, in the direction perpendicular to the first film 64a and the second film 64b. Upon application of external pressure, the film section 64 is warped and generates a strain in the strain sensing elements 50 provided thereon. The external pressure can be a pressure caused by e.g. acoustic waves, ultrasonic waves, or pressing force. That is, the film section 64 is deformed upon application of external pressure.

The film section 64 may be formed continuously outside the portion warped by external pressure. In this specification, the film section 64 is defined as a portion being thinner than the fixed end of a certain film thickness and warped by external pressure.

The film section 64 can be formed from an insulating material such as silicon oxide and silicon nitride. Alternatively, the film section 64 can be formed from a semiconductor material such as silicon, or a metal material. In the embodiment, the second film 64b is shaped integrally with the first film 64a. More specifically, the second film 64b is shaped integrally with the first film 64a from the same material as the first film 64a.

A cavity section 70 may exist below the film section 64. The cavity section 70 may be filled with a gas such as air and inert gas, or may be filled with liquid.

As shown in FIG. 1B, the strain sensing elements 50 according to the embodiment includes a first magnetic layer 51, a second magnetic layer 52, and an intermediate layer 53.

For instance, the direction from the first magnetic layer 51 toward the second magnetic layer 52 is referred to as Z-axis direction (stacking direction). One direction perpendicular to the Z-axis direction is referred to as X-axis direction. The direction perpendicular to the Z-axis direction and the X-axis direction is referred to as Y-axis direction.

The first magnetic layer 51 is spaced from the second magnetic layer 52 in the stacking direction. The intermediate layer 53 is provided between the first magnetic layer 51 and the second magnetic layer 52.

The first magnetic layer 51 is e.g. a magnetization free layer. When a strain occurs in the strain sensing elements 50 upon application of stress to the strain sensing elements 50, the magnetization of the first magnetic layer 51 is changed. For instance, the change of the magnetization of the first magnetic layer 51 is easier than the change of the magnetization of the second magnetic layer 52. This changes the relative angle between the magnetization of the first magnetic layer 51 and the magnetization of the second magnetic layer 52.

The second magnetic layer 52 is e.g. a reference layer. A magnetization fixed layer is used as the reference layer. Alternatively, a magnetization free layer is used as the reference layer.

FIGS. 2A to 2C are schematic sectional views illustrating the pressure sensor according to the first embodiment.

FIGS. 2A to 2C are sectional views taken along line A1-A2 of FIG. 1A.

In FIGS. 2A to 2C, for clarity of illustration, insulating portions and conductive portions are not shown.

The film section 64 includes a first film 64a and a second film 64b. The first film 64a includes a first region R1 and a second region R2. The first region R1 is located in a central part 64m of the film section 64. The second region R2 is located in a peripheral part 64n of the film section 64 (peripheral part around the first region R1). The second film 64b is provided on the first region R1. The thickness of the central part 64m of the film section 64 (the portion of the first region R1 of the first film 64a in combination with the second film 64b) is thicker than the thickness of the peripheral part 64n of the film section 64 (the portion of the second region R2 of the first film 64a). Here, the convex shape of the film section 64 may exist on the cavity section 70 side as shown in FIG. 2A. Alternatively, the convex shape of the film section 64 may exist on the opposite side of the film section 64 from the cavity section 70 as shown in FIG. 2B. Alternatively, the convex shape of the film section 64 may exist on both the cavity section 70 side and the opposite side from the cavity section 70 as shown in FIG. 2C.

The thickness t1 of the first film 64a can be set to e.g. 50 nanometers (nm) or more and 3 micrometers (μm) or less. In this case, preferably, the thickness t1 can be set to 200 nm or more and 1.5 μm or less.

In the case where the planar shape of the film section 64 is circular as illustrated in FIG. 1A, the diameter dimension of the film section 64 can be set to e.g. 1 μm or more and 600 μm or less. In this case, preferably, the diameter dimension of the film section 64 can be set to 60 μm or more and 600 μm or less. In the case where the planar shape of the film section 64 is square, the length of one side of the film section 64 can be set to e.g. 1 μm or more and 650 μm or less. In this case, preferably, the length of one side of the film section 64 can be set to 50 μm or more and 550 μm or less. In the case where the planar shape of the film section 64 is rectangular, the length of the short side of the film section 64 can be set to e.g. 1 μm or more and 500 μm or less. In this case, preferably, the length of the short side of the film section 64 can be set to 50 μm or more and 400 μm or less.

The ratio of the thickness of the central part 64m of the film section 64 (i.e., the total thickness of the thickness t1 of the first film 64a and the thickness t2 of the second film 64b (t21+t22 in the case of FIG. 2C) to the thickness of the peripheral part 64n of the film section 64 (i.e., the thickness t1 of the first film 64a) can be set to e.g. 1.1 times or more and 4 times or less. In this case, preferably, the ratio can be set to 1.5 times or more and 3 times or less. The relationship between the thickness of the central part 64m of the film section 64 and the thickness of the peripheral part 64n of the film section 64 is fitted in the aforementioned range. This sufficiently achieves the undermentioned effect of improving the performance of the sensor resulting from the film thickness difference provided between the central part 64m and the peripheral part 64n. Furthermore, this can suppress the noise of the sensor generated when the pressure sensor 310 is accelerated.

FIGS. 3A to 4C are schematic sectional views illustrating the shape of the film section according to the first embodiment.

Figure 3A:
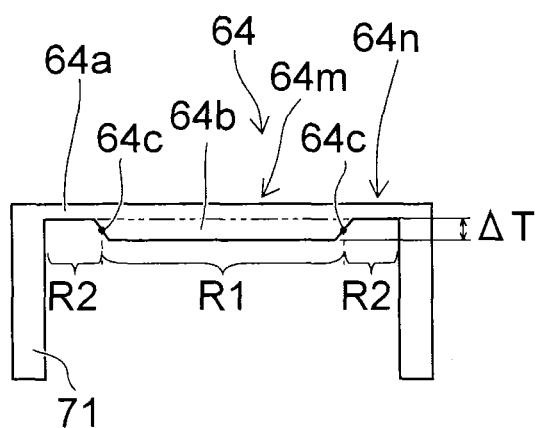
FIGS. 3A to 3C are schematic sectional views illustrating the shape of the film section according to the first embodiment.
Figure 3B:
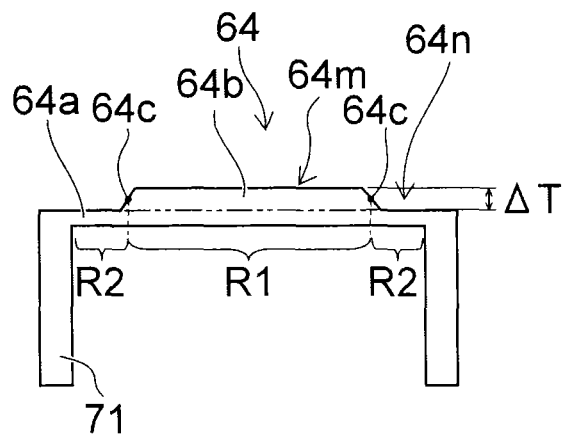
Figure 3C:
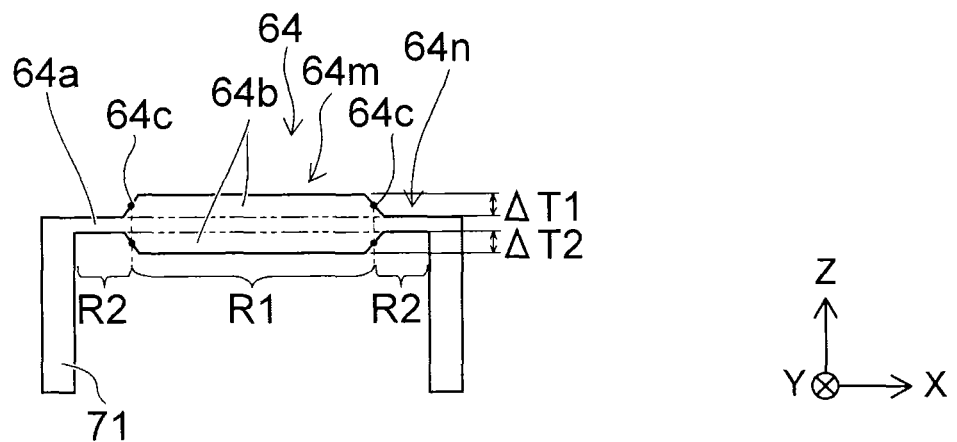

The second film 64b of the film section 64 may be joined to the first film 64a of the film section 64 stepwise as shown in FIGS. 2A to 2C. Alternatively, the second film 64b of the film section 64 may be joined to the first film 64a of the film section 64 with a tilt as shown in FIGS. 3A to 3C. Alternatively, the second film 64b of the film section 64 may be joined to the first film 64a of the film section 64 gradually with a curvature as shown in FIGS. 4A to 4C. In the case where the film section 64 is shaped as shown in FIGS. 3A to 4C, the boundary between the first region R1 of the first film 64a and the second region R2 of the first film 64a is defined as the portion (boundary 64c) where the difference ΔT (the difference ΔT1+ΔT2 in the case of FIGS. 3C and 4C) between the maximum thickness of the film section 64 and the minimum thickness of the film section 64 is halved.

FIGS. 5A to 5D are schematic plan views illustrating the film section of the pressure sensor according to the first embodiment.

Figure 5A:
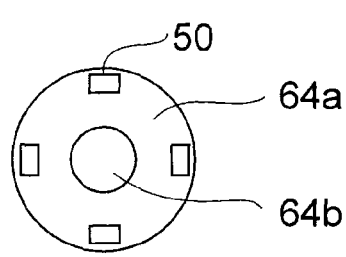
FIGS. 5A to 5D are schematic plan views illustrating the film section of the pressure sensor according to the first embodiment.
Figure 5B:
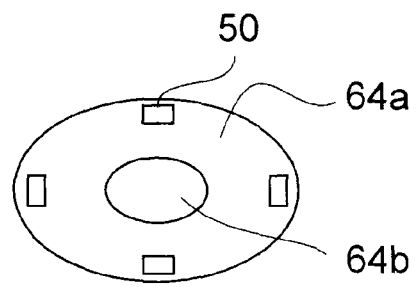
Figure 5C:
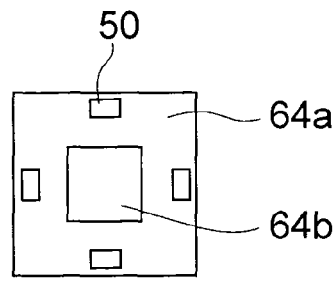
Figure 5D:
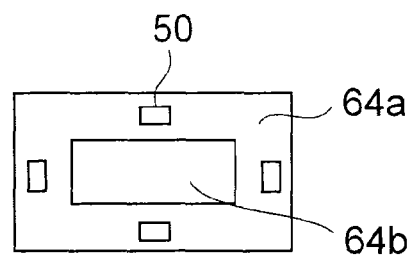

The film section 64 may be circular as shown in FIG. 5A, elliptic as shown in FIG. 5B, square as shown in FIG. 5C, or rectangular as shown in FIG. 5D. In the case where the film section 64 is shaped like a square or a rectangle, the corners may be sharp as shown in FIGS. 5C and 5D, or may be curved.

In view of symmetrically generating strains in a plurality of strain sensing elements 50 placed on the film section 64, preferably, the shape of the second film 64b of the film section 64 is geometrically similar to the shape of the first film 64a as shown in FIGS. 5A to 5D. However, the shape of the second film 64b may be geometrically nonsimilar to the shape of the first film 64a.

Figure 6A:
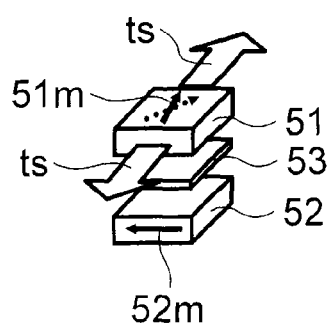
FIGS. 6A to 6C are schematic perspective views illustrating the operation of the strain sensing element according to the first embodiment.
Figure 6B:
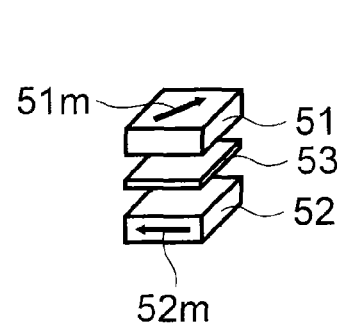
Figure 6C:
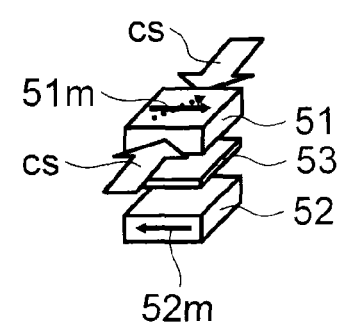

FIGS. 6A to 6C are schematic perspective views illustrating the operation of the strain sensing element according to the first embodiment.

FIG. 6A corresponds to the state of the strain sensing element 50 subjected to a tensile stress ts (stretched state STt).

FIG. 6B corresponds to the state of the strain sensing element 50 with no strain (unstrained state ST0). FIG. 6C corresponds to the state of the strain sensing element 50 subjected to a compressive stress cs (compressed state STc).

In FIGS. 6A to 6C, for clarity of illustration, the first magnetic layer 51, the second magnetic layer 52, and the intermediate layer 53 are depicted. In this example, the first magnetic layer 51 is a magnetization free layer, and the second magnetic layer 52 is a magnetization fixed layer.

The operation of the strain sensing element functioning as a strain sensor is based on the application of the "inverse magnetostriction effect" and the "magnetoresistance effect". The "inverse magnetostriction effect" is obtained in a ferromagnetic layer used in the magnetization free layer. The "magnetoresistance effect" is developed in a stacked film of the magnetization free layer, the intermediate layer, and the reference layer (e.g., magnetization fixed layer).

The "inverse magnetostriction effect" is a phenomenon in which the magnetization of a ferromagnetic body is changed by the strain generated in the ferromagnetic body. More specifically, when an external strain is applied to the stacked body of the strain sensing element, the magnetization direction of the magnetization free layer changes. As a result, the relative angle between the magnetization of the magnetization free layer and the magnetization of the reference layer (e.g., magnetization fixed layer) changes. This induces the change of electrical resistance by the "magnetoresistance effect (MR effect)". The MR effect includes e.g. the GMR (giant magnetoresistance) effect or the TMR (tunneling magnetoresistance) effect. The change in the relative angle of the magnetization direction is read as an electrical resistance change by passing a current in the stacked body. This develops the MR effect. For instance, a strain occurs in the stacked body (strain sensing element). The magnetization direction of the magnetization free layer is changed by the strain. This changes the relative angle between the magnetization direction of the magnetization free layer and the magnetization direction of the reference layer (e.g., magnetization fixed layer). That is, the MR effect is developed by the inverse magnetostriction effect.

The ferromagnetic material used in the magnetization free layer may have a positive magnetostriction coefficient. In this case, the magnetization direction changes so as to decrease the angle between the magnetization direction and the direction of the tensile strain and to increase the angle between the magnetization direction and the direction of the compressive strain. The ferromagnetic material used in the magnetization free layer may have a negative magnetostriction coefficient. In this case, the magnetization direction changes so as to increase the angle between the magnetization direction and the direction of the tensile strain and to decrease the angle between the magnetization direction and the direction of the compressive strain.

The combination of the materials of the stacked body of the magnetization free layer, the intermediate layer, and the reference layer (e.g., magnetization fixed layer) may have a positive magnetoresistance effect. In this case, the electrical resistance decreases if the relative angle between the magnetization free layer and the magnetization fixed layer is small. The combination of the materials of the stacked body of the magnetization free layer, the intermediate layer, and the reference layer (e.g., magnetization fixed layer) may have a negative magnetoresistance effect. In this case, the electrical resistance increases if the relative angle between the magnetization free layer and the magnetization fixed layer is small.

In the following, an example change of magnetization is described with reference to an example case. In this case, the ferromagnetic materials used in the magnetization free layer and the reference layer (e.g., magnetization fixed layer) each have a positive magnetostriction coefficient. Furthermore, the stacked body including the magnetization free layer, the intermediate layer, and the reference layer (e.g., magnetization fixed layer) has a positive magnetoresistance effect.

As shown in FIG. 6B, in the unstrained state ST0 with no strain (e.g., the initial state), the relative angle between the magnetization 51m of the first magnetic layer (magnetization free layer) 51 and the magnetization 52m of the second magnetic layer (e.g., magnetization fixed layer) 52 is set to a prescribed value. The direction of the magnetization 51m of the magnetic layer in the initial state of the first magnetic layer (magnetization free layer) 51 is set by e.g. hard bias or shape anisotropy of the magnetic layer. In this example, the magnetization 51m of the first magnetic layer (magnetization free layer) 51 crosses the magnetization 52m of the second magnetic layer (e.g., magnetization fixed layer) 52.

As shown in FIG. 6A, in the stretched state STt, upon application of a tensile stress ts, a strain depending on the tensile stress ts occurs in the strain sensing element 50. At this time, the magnetization 51m of the first magnetic layer (magnetization free layer) 51 changes from the unstrained state ST0 so as to decrease the angle between the magnetization 51m and the direction of the tensile stress ts. In the example shown in FIG. 6A, when the tensile stress ts is applied, the relative angle between the magnetization 51m of the first magnetic layer (magnetization free layer) 51 and the magnetization 52m of the second magnetic layer (e.g., magnetization fixed layer) 52 is smaller than in the unstrained state ST0. This decreases the electrical resistance in the strain sensing element 50 relative to the electrical resistance in the unstrained state ST0.

As shown in FIG. 6C, in the compressed state STc, upon application of a compressive stress cs, the magnetization 51m of the first magnetic layer (magnetization free layer) 51 changes from the unstrained state ST0 so as to increase the angle between the magnetization 51m and the direction of the compressive stress cs. In the example shown in FIG. 6C, when the compressive stress cs is applied, the relative angle between the magnetization 51m of the first magnetic layer (magnetization free layer) 51 and the magnetization 52m of the second magnetic layer (e.g., magnetization fixed layer) 52 is larger than in the unstrained state ST0. This increases the electrical resistance in the strain sensing element 50.

Thus, in the strain sensing element, the change of strain generated in the strain sensing element is transformed to the change of electrical resistance. In the above operation, the amount of change of electrical resistance (dR/R) per unit strain (dε) is referred to as gauge factor (GF). A strain sensor with high sensitivity is obtained by using a strain sensing element with high gauge factor.

Figure 7:
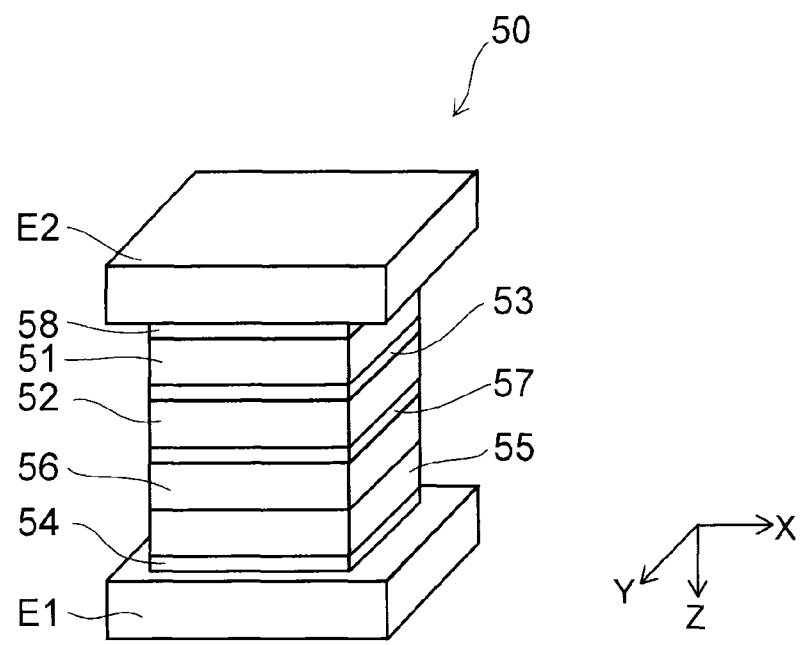
FIG. 7 is a schematic perspective view illustrating the strain sensing element according to the first embodiment.

FIG. 7 is a schematic perspective view illustrating the strain sensing element according to the first embodiment.

As shown in FIG. 7, the strain sensing element 50 used in the embodiment includes a lower electrode E1, a foundation layer 54, a pinning layer 55, a second magnetization fixed layer 56, a magnetic coupling layer 57, a first magnetization fixed layer (second magnetic layer) 52, an intermediate layer 53, a magnetization free layer (first magnetic layer) 51, a cap layer 58, and an upper electrode E2. The first magnetization fixed layer 52 corresponds to the second magnetic layer. The magnetization free layer 51 corresponds to the first magnetic layer. The foundation layer 54 is provided between the lower electrode E1 and the upper electrode E2. The pinning layer 55 is provided between the foundation layer 54 and the upper electrode E2. The second magnetization fixed layer 56 is provided between the pinning layer 55 and the upper electrode E2. The magnetic coupling layer 57 is provided between the second magnetization fixed layer 56 and the upper electrode E2. The first magnetization fixed layer 52 is provided between the magnetic coupling layer 57 and the upper electrode E2. The intermediate layer 53 is provided between the first magnetization fixed layer 52 and the upper electrode E2. The magnetization free layer 51 is provided between the intermediate layer 53 and the upper electrode E2. The cap layer 58 is provided between the magnetization free layer 51 and the upper electrode E2.

The foundation layer 54 is made of e.g. Ta/Ru. The thickness (length in the Z-axis direction) of this Ta layer is e.g. 3 nanometers (nm). The thickness of this Ru layer is e.g. 2 nm.

The pinning layer 55 is e.g. an IrMn layer having a thickness of 7 nm.

The second magnetization fixed layer 56 is e.g. a $Co_{75}Fe_{25}$ layer having a thickness of 2.5 nm.

The magnetic coupling layer 57 is e.g. a Ru layer having a thickness of 0.9 nm.

The first magnetization fixed layer 52 is e.g. a $Co_{40}Fe_{40}B_{20}$ layer having a thickness of 3 nm.

The intermediate layer 53 is e.g. an MgO layer having a thickness of 1.6 nm.

The magnetization free layer 51 is made of e.g. $Co_{40}Fe_{40}B_{20}$ having a thickness of 4 nm.

The cap layer 58 is made of e.g. Ta/Ru. The thickness of this Ta layer is e.g. 1 nm. The thickness of this Ru layer is e.g. 5 nm.

The lower electrode E1 and the upper electrode E2 are made of e.g. at least one of aluminum (Al), aluminum-copper alloy (Al—Cu), copper (Cu), silver (Ag), and gold (Au). Thus, the lower electrode E1 and the upper electrode E2 are made of such a material having relatively low electrical resistance. Accordingly, the current can be efficiently passed in the strain sensing element 50. The lower electrode E1 and the upper electrode E2 can be made of a nonmagnetic material.

The lower electrode E1 and the upper electrode E2 may include e.g. a foundation layer (not shown) for the lower electrode E1 and the upper electrode E2, a cap layer (not shown) for the lower electrode E1 and the upper electrode E2, and a layer of at least one of Al, Al—Cu, Cu, Ag, and Au provided therebetween. For instance, the lower electrode E1 and the upper electrode E2 are made of tantalum (Ta)/copper (Cu)/tantalum (Ta) or the like. Use of Ta for the foundation layer of the lower electrode E1 and the upper electrode E2 improves e.g. adhesiveness of the film section 64 to the lower electrode E1 and the upper electrode E2. The foundation layer for the lower electrode E1 and the upper electrode E2 may be made of e.g. titanium (Ti) or titanium nitride (TiN).

Use of Ta for the cap layer of the lower electrode E1 and the upper electrode E2 can prevent oxidation of copper (Cu) or the like below the cap layer. The cap layer for the lower electrode E1 and the upper electrode E2 may be made of e.g. titanium (Ti) or titanium nitride (TiN).

The foundation layer 54 can be based on e.g. a stacked structure including a buffer layer (not shown) and a seed layer (not shown). This buffer layer relaxes e.g. roughening of the surface of the lower electrode E1 or the film section 64 and improves the crystallinity of the layer stacked on this buffer layer. The buffer layer is made of e.g. at least one selected from the group consisting of tantalum (Ta), titanium (Ti), vanadium (V), tungsten (W), zirconium (Zr), hafnium (Hf), and chromium (Cr). The buffer layer may be made of an alloy including at least one material selected from these materials.

The thickness of the buffer layer of the foundation layer 54 is preferably 1 nm or more and 10 nm or less. More preferably, the thickness of the buffer layer is 1 nm or more and 5 nm or less. If the thickness of the buffer layer is too thin, the buffering effect is lost. If the thickness of the buffer layer is too thick, the thickness of the strain sensing element 50 is excessively thickened. A seed layer can be formed on the buffer layer. The seed layer can achieve the buffering effect. In this case, the buffer layer may be omitted. The buffer layer is e.g. a Ta layer having a thickness of 3 nm.

The seed layer of the foundation layer 54 controls the crystal orientation of the layer stacked on this seed layer. The seed layer controls the crystal grain diameter of the layer stacked on this seed layer. This seed layer is made of e.g. a metal having the fcc structure (face-centered cubic structure), hcp structure (hexagonal close-packed structure), or bcc structure (body-centered cubic structure).

The seed layer of the foundation layer 54 may be made of ruthenium (Ru) having the hcp structure, NiFe having the fcc structure, or Cu having the fcc structure. Thus, for instance, the crystal orientation of the spin valve film on the seed layer can be set to fcc (111) orientation. The seed layer is e.g. a Cu layer having a thickness of 2 nm or a Ru layer having a thickness of 2 nm. In the case of enhancing the crystal orientation of the layer formed on the seed layer, the thickness of the seed layer is preferably 1 nm or more and 5 nm or less. More preferably, the thickness of the seed layer is 1 nm or more and 3 nm or less. This sufficiently develops the function of the seed layer for improving the crystal orientation.

On the other hand, for instance, in the case where there is no need to provide crystal orientation in the layer formed on the seed layer (e.g., in the case of forming an amorphous magnetization free layer), the seed layer may be omitted. The seed layer is e.g. a Cu layer having a thickness of 2 nm.

The pinning layer 55 fixes the magnetization of the second magnetization fixed layer 56 by e.g. providing unidirectional anisotropy to the second magnetization fixed layer 56 (ferromagnetic layer) formed on the pinning layer 55. The pinning layer 55 is e.g. an antiferromagnetic layer. The pinning layer 55 is made of e.g. at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The pinning layer 55 may be made of an alloy in which an additive element is further added to Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the pinning layer 55 is appropriately set in order to provide unidirectional anisotropy of sufficient strength.

The magnetization of the ferromagnetic layer in contact with the pinning layer 55 is fixed by heat treatment under application of magnetic field. The magnetization of the ferromagnetic layer in contact with the pinning layer 55 is fixed to the direction of the magnetic field applied during the heat treatment. The annealing temperature is set equal to or higher than e.g. the magnetization fixation temperature of the antiferromagnetic material used for the pinning layer 55. In the case of using an antiferromagnetic layer including Mn, Mn may diffuse into the layer other than the pinning layer 55 and reduce the MR change rate. Thus, it is desirable to set the annealing temperature equal to or lower than the temperature at which diffusion of Mn occurs. For instance, the annealing temperature can be set to 200 degrees (° C.) or more and 500 degrees (° C.) or less. Preferably, the annealing temperature can be set to 250 degrees (° C.) or more and 400 degrees (° C.) or less.

In the case where the pinning layer 55 is made of PtMn or PdPtMn, the thickness of the pinning layer 55 is preferably 8 nm or more and 20 nm or less. More preferably, the thickness of the pinning layer 55 is 10 nm or more and 15 nm or less. In the case where the pinning layer 55 is made of IrMn, the pinning layer 55 can be provided with unidirectional anisotropy using a thickness thinner than the pinning layer 55 made of PtMn. In this case, the thickness of the pinning layer 55 is preferably 4 nm or more and 18 nm or less. More preferably, the thickness of the pinning layer 55 is 5 nm or more and 15 nm or less. The pinning layer 55 is e.g. an $Ir_{22}Mn_{78}$ layer having a thickness of 7 nm.

The pinning layer 55 may be a hard magnetic layer. The hard magnetic layer is made of e.g. a hard magnetic material having relatively high magnetic anisotropy and coercivity such as Co—Pt, Fe—Pt, Co—Pd, and Fe—Pd. The hard magnetic layer may be made of an alloy in which an additive element is further added to Co—Pt, Fe—Pt, Co—Pd, and Fe—Pd. For instance, the hard magnetic layer may be made of CoPt (the ratio of Co being 50 at. % or more and 85 at. % or less), $(Co_xPt_{100-x})_{100-y}Cr_y$ (x being 50 at. % or more and 85 at. % or less, and y being 0 at. % or more and 40 at. % or less), or FePt (the ratio of Pt being 40 at. % or more and 60 at. % or less).

The second magnetization fixed layer 56 is made of e.g. $Co_xFe_{100-x}$ alloy (x being 0 at. % or more and 100 at. % or less), $Ni_xFe_{100-x}$ alloy (x being 0 at. % or more and 100 at. % or less), or a material in which a nonmagnetic element is added thereto. The second magnetization fixed layer 56 is made of e.g. at least one selected from the group consisting of Co, Fe, and Ni. The second magnetization fixed layer 56 may be made of an alloy including at least one material selected from these materials. Alternatively, the second magnetization fixed layer 56 can be made of $(Co_xFe_{100-x})_{100-y}B_y$ alloy (x being 0 at. % or more and 100 at. % or less, and y being 0% or more and 30% or less). The second magnetization fixed layer 56 may be made of an amorphous alloy of $(Co_xFe_{100-x})_{100-y}B_y$. This can suppress the variation of characteristics of the strain sensing element 50 even in the case where the size of the strain sensing element 50 is small.

The thickness of the second magnetization fixed layer 56 is preferably e.g. 1.5 nm or more and 5 nm or less. This can further strengthen e.g. the strength of unidirectional anisotropic magnetic field caused by the pinning layer 55. For instance, the strength of the antiferromagnetic coupling magnetic field between the second magnetization fixed layer 56 and the first magnetization fixed layer 52 can be further strengthened via the magnetic coupling layer 57 formed on the second magnetization fixed layer 56. For instance, preferably, the magnetic film thickness (the product (Bs·t) of the saturation magnetization Bs and the thickness t) of the second magnetization fixed layer 56 is substantially equal to the magnetic film thickness of the first magnetization fixed layer 52.

The saturation magnetization of $Co_{40}Fe_{40}B_{20}$ in a thin film is approximately 1.9 T (tesla). For instance, the first magnetization fixed layer 52 may be a $Co_{40}Fe_{40}B_{20}$ layer having a thickness of 3 nm. Then, the magnetic film thickness of the first magnetization fixed layer 52 is 1.9 T×3 nm=5.7 Tnm. On the other hand, the saturation magnetization of $Co_{75}Fe_{25}$ is approximately 2.1 T. The thickness of the second magnetization fixed layer 56 achieving a magnetic film thickness equal to the foregoing is 5.7 Tnm/2.1 T=2.7 nm. In this case, the second magnetization fixed layer 56 is preferably a $Co_{75}Fe_{25}$ layer having a thickness of approximately 2.7 nm. The second magnetization fixed layer 56 is e.g. a $Co_{75}Fe_{25}$ layer having a thickness of 2.5 nm.

The strain sensing element 50 is based on a synthetic pinned structure made of the second magnetization fixed layer 56, the magnetic coupling layer 57, and the first magnetization fixed layer 52. Instead, the strain sensing element 50 may be based on a single pinned structure made of a single magnetization fixed layer. In the case of using the single pinned structure, the magnetization fixed layer is e.g. a $Co_{40}Fe_{40}B_{20}$ layer having a thickness of 3 nm. The ferromagnetic layer used for the magnetization fixed layer of the single pinned structure may be made of the same material as the aforementioned material of the second magnetization fixed layer 56.

The magnetic coupling layer 57 causes antiferromagnetic coupling between the second magnetization fixed layer 56 and the first magnetization fixed layer 52. The magnetic coupling layer 57 forms a synthetic pinned structure. The magnetic coupling layer 57 is made of e.g. Ru. The thickness of the magnetic coupling layer 57 is preferably e.g. 0.8 nm or more and 1 nm or less. The magnetic coupling layer 57 may be made of a material other than Ru as long as the material can cause sufficient antiferromagnetic coupling between the second magnetization fixed layer 56 and the first magnetization fixed layer 52. The thickness of the magnetic coupling layer 57 can be set to a thickness of 0.8 nm or more and 1 nm or less corresponding to the second peak (2nd peak) of the RKKY (Ruderman-Kittel-Kasuya-Yosida) coupling. Alternatively, the thickness of the magnetic coupling layer 57 may be set to a thickness of 0.3 nm or more and 0.6 nm or less corresponding to the first peak (1st peak) of the RKKY coupling. The magnetic coupling layer 57 is made of e.g. Ru having a thickness of 0.9 nm. This stably achieves coupling with high reliability.

The magnetic layer used for the first magnetization fixed layer 52 directly contributes to the MR effect. The first magnetization fixed layer 52 is made of e.g. Co—Fe—B alloy. Specifically, the first magnetization fixed layer 52 can be made of $(Co_xFe_{100-x})_{100-y}B_y$ alloy (x being 0 at. % or more and 100 at. % or less, and y being 0 at. % or more and 30 at. % or less). The first magnetization fixed layer 52 may be made of an amorphous alloy of $(Co_xFe_{100-x})_{100-y}B_y$. This can suppress e.g. the variation between the elements due to crystal grains even in the case where the size of the strain sensing element 50 is small.

The first magnetization fixed layer 52 can planarize a layer (e.g., tunnel insulating layer (not shown)) formed on the first magnetization fixed layer 52. The planarization of the tunnel insulating layer can reduce the defect density of the tunnel insulating layer. This can achieve a higher MR change rate based on a lower area resistance. For instance, the material of the tunnel insulating layer may be MgO. In this case, the first magnetization fixed layer 52 may be made of an amorphous alloy of $(Co_xFe_{100-x})_{100-y}B_y$. This can enhance the (100) orientation of the MgO layer formed on the tunnel insulating layer. A higher (100) orientation of the MgO layer results in a higher MR change rate. The $(Co_xFe_{100-x})_{100-y}B_y$ alloy is crystallized with the (100) surface of the MgO layer serving as a template during annealing. This achieves good crystal matching between MgO and the $(Co_xFe_{100-x})_{100-y}B_y$ alloy. Good crystal matching results in a higher MR change rate.

Besides the Co—Fe—B alloy, the first magnetization fixed layer 52 may be made of e.g. Fe—Co alloy.

If the first magnetization fixed layer 52 is thicker, a higher MR change rate is obtained. For a higher fixed magnetic field, the first magnetization fixed layer 52 is preferably thinner. There is a tradeoff in the thickness of the first magnetization fixed layer 52 between the MR change rate and the fixed magnetic field. In the case where the first magnetization fixed layer 52 is made of Co—Fe—B alloy, the thickness of the first magnetization fixed layer 52 is preferably 1.5 nm or more and 5 nm or less. More preferably, the thickness of the first magnetization fixed layer 52 is 2.0 nm or more and 4 nm or less.

Besides the aforementioned materials, the first magnetization fixed layer 52 is made of $Co_{90}Fe_{10}$ alloy having the fcc structure, Co having the hcp structure, or Co alloy having the hcp structure. The first magnetization fixed layer 52 is made of e.g. at least one selected from the group consisting of Co, Fe, and Ni. The first magnetization fixed layer 52 is made of an alloy including at least one material selected from these materials. The first magnetization fixed layer 52 may be made of a FeCo alloy material having the bcc structure, a Co alloy having a cobalt composition of 50% or more, or a material having a Ni composition of 50% or more (Ni alloy). This achieves e.g. a higher MR change rate.

The first magnetization fixed layer 52 can be e.g. a Heusler magnetic alloy layer such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, and $Co_2FeGa_{0.5}Ge_{0.5}$. For instance, the first magnetization fixed layer 52 is e.g. a $Co_{40}Fe_{40}B_{20}$ layer having a thickness of 3 nm.

The intermediate layer 53 breaks e.g. magnetic coupling between the first magnetic layer 51 and the second magnetic layer 52. The intermediate layer 53 is made of e.g. metal, insulator, or semiconductor. The metal is e.g. Cu, Au, or Ag. In the case where the intermediate layer 53 is made of metal, the thickness of the intermediate layer 53 is e.g. approximately 1 nm or more and 7 nm or less. The insulator or semiconductor is e.g. magnesium oxide (such as MgO), aluminum oxide (such as $Al_2O_3$), titanium oxide (such as TiO), zinc oxide (such as ZnO), or gallium oxide (Ga—O). In the case where the intermediate layer 53 is made of insulator or semiconductor, the thickness of the intermediate layer 53 is e.g. approximately 0.6 nm or more and 2.5 nm or less. The intermediate layer 53 may be e.g. a CCP (current-confined-path) spacer layer. In the case where the spacer layer is a CCP spacer layer, the spacer layer is based on a structure in which e.g. a copper (Cu) metal path is formed in an insulating layer of aluminum oxide ($Al_2O_3$). For instance, the intermediate layer 53 is an MgO layer having a thickness of 1.6 nm.

The magnetization free layer 51 is made of a ferromagnetic material. The magnetization free layer 51 can be made of a ferromagnetic material including e.g. Fe, Co, and Ni. The material of the magnetization free layer 51 is e.g. FeCo alloy or NiFe alloy. Alternatively, the magnetization free layer 51 is made of Co—Fe—B alloy, Fe—Co—Si—B alloy, Fe—Ga alloy having large λs (magnetostriction constant), Fe—Co—Ga alloy, Tb-M-Fe alloy, Tb-M1-Fe-M2 alloy, Fe-M3-M4-B alloy, Ni, Fe—Al, or ferrite. In the aforementioned Tb-M-Fe alloy, M is at least one selected from the group consisting of Sm, Eu, Gd, Dy, Ho, and Er. In the aforementioned Tb-M1-Fe-M2 alloy, M1 is at least one selected from the group consisting of Sm, Eu, Gd, Dy, Ho, and Er. M2 is at least one selected from the group consisting of Ti, Cr, Mn, Co, Cu, Nb, Mo, W, and Ta. In the aforementioned Fe-M3-M4-B alloy, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. The aforementioned ferrite can be e.g. $Fe_3O_4$ or $(FeCo)_3O_4$. The thickness of the magnetization free layer 51 is e.g. 2 nm or more.

The magnetization free layer 51 may be made of a magnetic material containing boron. The magnetization free layer 51 may be made of e.g. an alloy including at least one element selected from the group consisting of Fe, Co, and Ni, and boron (B). For instance, the magnetization free layer 51 can be made of Co—Fe—B alloy or Fe—B alloy. For instance, the magnetization free layer 51 can be made of $Co_{40}Fe_{40}B_{20}$ alloy. In the case where the magnetization free layer 51 is made of an alloy including at least one element selected from the group consisting of Fe, Co, and Ni, and boron (B), the alloy may be added with e.g. Ga, Al, Si, or W as an element for promoting high magnetostriction. For instance, the magnetization free layer 51 may be made of Fe—Ga—B alloy, Fe—Co—Ga—B alloy, or Fe—Co—Si—B alloy. Use of such a magnetic material containing boron decreases the coercivity (Hc) of the magnetization free layer 51 and facilitates change of magnetization in response to strain. This can achieve high strain sensitivity.

The boron concentration (e.g., the composition ratio of boron) in the magnetization free layer 51 is preferably 5 at. % (atomic percent) or more. This facilitates obtaining an amorphous structure. The boron concentration in the magnetization free layer 51 is preferably 35 at. % or less. If the boron concentration is too high, for instance, the magnetostriction constant decreases. The boron concentration in the magnetization free layer 51 is preferably e.g. 5 at. % or more and 35 at. % or less. More preferably, the boron concentration in the magnetization free layer 51 is 10 at. % or more and 30 at. % or less.

Part of the magnetic layer of the magnetization free layer 51 may be made of $Fe_{1-y}B_y$ ($0<y\leq0.3$) or $(Fe_aX_{1-a})_{1-y}B_y$ (X=Co or Ni, $0.8\leq a<1$, $0<y\leq0.3$). This facilitates compatibility between large magnetostriction constant λ and low coercivity. Thus, this is preferable particularly in view of obtaining high gauge factor. For instance, the magnetization free layer 51 can be made of $Fe_{80}B_{20}$ (4 nm). The magnetization free layer 51 can be made of $Co_{40}Fe_{40}B_{20}$ (0.5 nm)/$Fe_{80}B_{20}$ (4 nm).

The magnetization free layer 51 may have a multilayer structure. The intermediate layer 53 may be a tunnel insulating layer of MgO. In this case, a layer of Co—Fe—B alloy is preferably provided in the portion of the magnetization free layer 51 in contact with the intermediate layer 53. This achieves high magnetoresistance effect. In this case, the layer of Co—Fe—B alloy is provided on the intermediate layer 53, and another magnetic material having large magnetostriction constant is provided on the layer of Co—Fe—B alloy. In the case where the magnetization free layer 51 has a multilayer structure, the magnetization free layer 51 is made of e.g. Co—Fe—B (2 nm)/Fe—Co—Si—B (4 nm).

The cap layer 58 protects a layer provided below the cap layer 58. The cap layer 58 is made of e.g. a plurality of metal layers. The cap layer 58 is based on e.g. a two-layer structure (Ta/Ru) of a Ta layer and a Ru layer. The thickness of this Ta layer is e.g. 1 nm. The thickness of this Ru layer is e.g. 5 nm. Instead of the Ta layer and the Ru layer, the cap layer 58 may be made of another metal layer. The configuration of the cap layer 58 is arbitrary. For instance, the cap layer 58 can be made of a nonmagnetic material. The cap layer 58 may be made of another material as long as it can protect the layer provided below the cap layer 58.

In the case where the magnetization free layer 51 is made of a magnetic material containing boron, a diffusion prevention layer of an oxide material or nitride material, not shown, may be provided between the magnetization free layer 51 and the cap layer 58 in order to prevent diffusion of boron. Use of a diffusion prevention layer made of an oxide layer or nitride layer can suppress diffusion of boron contained in the magnetization free layer 51 and keep the amorphous structure of the magnetization free layer 51. Specifically, the oxide material or nitride material used for the diffusion prevention layer can be an oxide material or nitride material including an element such as Mg, Al, Si, Ti, V, Cr, Mn, Fe, Co, Ni, Cu, Zn, Zr, Nb, Mo, Ru, Rh, Pd, Ag, Hf, Ta, W, Sn, Cd, and Ga. Here, the diffusion prevention layer is a layer not contributing to the magnetoresistance effect. Thus, its area resistance is preferably low. For instance, the area resistance of the diffusion prevention layer is preferably set lower than the area resistance of the intermediate layer 53 contributing to the magnetoresistance effect. In view of decreasing the area resistance of the diffusion prevention layer, an oxide or nitride of Mg, Ti, V, Zn, Sn, Cd, or Ga having low barrier height is preferable. For the function of suppressing diffusion of boron, an oxide with stronger chemical coupling is preferable. For instance, the oxide can be MgO of 1.5 nm. An oxynitride can be regarded as either oxide or nitride.

In the case where the diffusion prevention layer is made of an oxide material or nitride material, the film thickness of the diffusion prevention layer is preferably 0.5 nm or more in view of sufficiently developing the function of preventing diffusion of boron. The film thickness of the diffusion prevention layer is preferably 5 nm or less in view of decreasing the area resistance. That is, the film thickness of the diffusion prevention layer is preferably 0.5 nm or more and 5 nm or less. In particular, the film thickness of the diffusion prevention layer is preferably 1 nm or more and 3 nm or less.

The diffusion prevention layer can be made of at least one selected from the group consisting of magnesium (Mg), silicon (Si), and aluminum (Al). The diffusion prevention layer can be made of a material including these light elements. These light elements produce a compound by coupling with boron. At least one of e.g. an Mg—B compound, Al—B compound, and Si—B compound is formed in the portion including the interface between the diffusion prevention layer and the magnetization free layer 51. These compounds suppress diffusion of boron.

Another metal layer or the like may be inserted between the diffusion prevention layer and the magnetization free layer 51. However, if the distance between the diffusion prevention layer and the magnetization free layer 51 is too large, boron diffuses therebetween. This decreases the boron concentration in the magnetization free layer 51. Thus, the distance between the diffusion prevention layer and the magnetization free layer 51 is preferably 10 nm or less. More preferably, the distance is 3 nm or less.

Figure 8A:
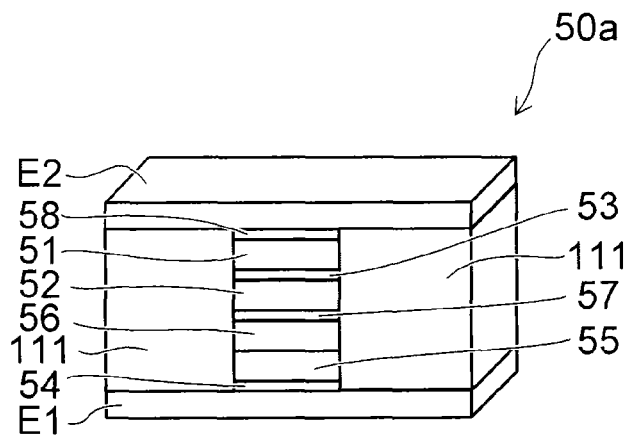
FIGS. 8A and 8B are schematic perspective views illustrating alternative examples of the strain sensing element according to the embodiment.
Figure 8B:
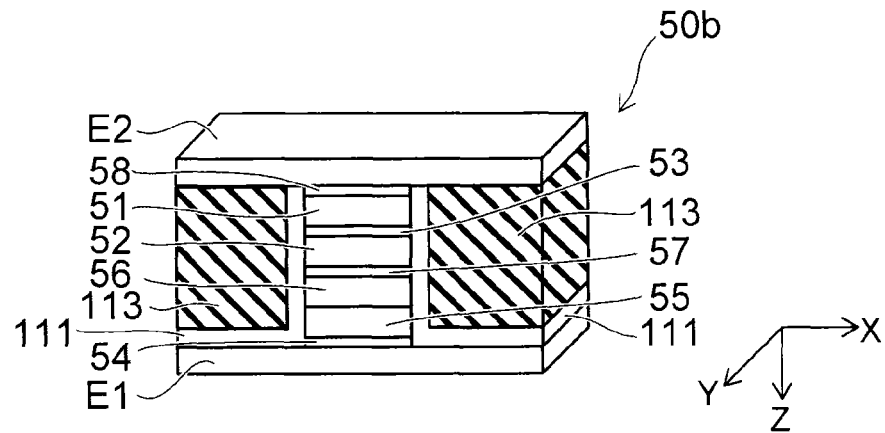

FIGS. 8A and 8B are schematic perspective views illustrating alternative examples of the strain sensing element according to the embodiment.

As illustrated in FIG. 8A, the strain sensing element 50a includes an insulating layer 111. More specifically, two insulating layers (insulating portions) 111 spaced from each other are provided between the lower electrode E1 and the upper electrode E2. A stacked body is placed between the two insulating layers 111. The stacked body is placed between the lower electrode E1 and the upper electrode E2. The stacked body shown in FIG. 8A is the stacked body shown in FIG. 7. That is, the insulating layer 111 is provided opposite to the sidewall of the stacked body.

The insulating layer 111 can be made of e.g. aluminum oxide (e.g., $Al_2O_3$) or silicon oxide (e.g., $SiO_2$). The insulating layer 111 can suppress the leakage current around the stacked body.

As illustrated in FIG. 8B, the strain sensing element 50b further includes a hard bias layer 113. More specifically, two hard bias layers (hard bias portions) 113 spaced from each other are provided between the lower electrode E1 and the upper electrode E2. A stacked body is placed between the two hard bias layers 113. An insulating layer 111 is placed between the hard bias layer 113 and the stacked body. Furthermore, in this example, the insulating layer 111 extends between the hard bias layer 113 and the lower electrode E1.

The hard bias layer 113 sets the magnetization of the magnetization free layer (first magnetic layer) 51 to a desired direction by the magnetization of the hard bias layer 113. The hard bias layer 113 can set the magnetization of the magnetization free layer (first magnetic layer) 51 to a desired direction when no force is applied to the substrate (film section 64).

The hard bias layer 113 is made of e.g. a hard magnetic material having relatively high magnetic anisotropy and coercivity such as Co—Pt, Fe—Pt, Co—Pd, and Fe—Pd. The hard bias layer 113 may be made of an alloy in which an additive element is further added to Co—Pt, Fe—Pt, Co—Pd, and Fe—Pd. For instance, the hard bias layer 113 may be made of CoPt (the ratio of Co being 50 at. % or more and 85 at. % or less), $(Co_xPt_{100-x})_{100-y}Cr_y$ (x being 50 at. % or more and 85 at. % or less, and y being 0 at. % or more and 40 at. % or less), or FePt (the ratio of Pt being 40 at. % or more and 60 at. % or less). In the case of using such a material, the magnetization direction of the hard bias layer 113 can be set (fixed) to the direction of application of external magnetic field by applying an external magnetic field larger than the coercivity of the hard bias layer 113. The thickness of the hard bias layer 113 (e.g., the length along the direction from the lower electrode E1 toward the upper electrode E2) is e.g. 5 nm or more and 50 nm or less.

As shown in FIG. 8B, the insulating layer 111 may be placed between the lower electrode E1 and the upper electrode E2. In this case, the material of the insulating layer 111 can be $SiO_x$ or $AlO_x$. Furthermore, a foundation layer, not shown, may be provided between the insulating layer 111 and the hard bias layer 113. In the case where the hard bias layer 113 is made of a hard magnetic material having relatively high magnetic anisotropy and coercivity such as Co—Pt, Fe—Pt, Co—Pd, and Fe—Pd, the material of the foundation layer for the hard bias layer 113 can be e.g. Cr or Fe—Co. The aforementioned hard bias layer 113 is applicable to any of the strain sensing elements described in this embodiment.

The hard bias layer 113 may have a structure stacked on a pinning layer for the hard bias layer 113, not shown. In this case, the magnetization direction of the hard bias layer 113 can be set (fixed) by exchange coupling between the hard bias layer 113 and the pinning layer for the hard bias layer 113. In this case, the hard bias layer 113 can be made of a ferromagnetic material including at least one of Fe, Co, and Ni, or an alloy including at least one of them. In this case, the hard bias layer 113 can be made of e.g. $Co_xFe_{100-x}$ alloy (x being 0 at. % or more and 100 at. % or less), $Ni_xFe_{100-x}$ alloy (x being 0 at. % or more and 100 at. % or less), or a material in which a nonmagnetic element is added thereto. The hard bias layer 113 can be made of a material like the aforementioned first magnetization fixed layer 52. The pinning layer for the hard bias layer 113 can be made of a material like the aforementioned pinning layer 55 in the strain sensing element 50. In the case of providing a pinning layer for the hard bias layer 113, a foundation layer like the material described with reference to the foundation layer 54 may be provided below the pinning layer for the hard bias layer 113. The pinning layer for the hard bias layer 113 may be provided below or above the hard bias layer 113. The magnetization direction of the hard bias layer 113 in this case can be determined by heat treatment in magnetic field as described with reference to the pinning layer 55 in the strain sensing element 50.

The hard bias layer 113 and the insulating layer 111 described above are applicable to any of the strain sensing elements described in this embodiment. In the case of using the aforementioned stacked structure of the hard bias layer 113 and the pinning layer for the hard bias layer 113, a large external magnetic field may be instantaneously applied to the hard bias layer 113. Even in this case, the magnetization direction of the hard bias layer 113 can be easily maintained.

FIGS. 9A to 9D are schematic perspective views illustrating alternative strain sensing elements that can be fabricated by the manufacturing method according to the first embodiment.

As shown in FIG. 9A, the strain sensing element 50c used in the embodiment includes a lower electrode E1, a foundation layer 54, a magnetization free layer (first magnetic layer) 51, an intermediate layer 53, a first magnetization fixed layer (second magnetic layer) 52, a magnetic coupling layer 57, a second magnetization fixed layer 56, a pinning layer 55, a cap layer 58, and an upper electrode E2. The magnetization free layer 51 corresponds to the first magnetic layer. The first magnetization fixed layer 52 corresponds to the second magnetic layer.

The foundation layer 54 is provided between the lower electrode E1 and the upper electrode E2. The magnetization free layer 51 is provided between the foundation layer 54 and the upper electrode E2. The intermediate layer 53 is provided between the magnetization free layer 51 and the upper electrode E2. The first magnetization fixed layer 52 is provided between the intermediate layer 53 and the upper electrode E2. The magnetic coupling layer 57 is provided between the first magnetization fixed layer 52 and the upper electrode E2. The second magnetization fixed layer 56 is provided between the magnetic coupling layer 57 and the upper electrode E2. The pinning layer 55 is provided between the second magnetization fixed layer 56 and the upper electrode E2. The cap layer 58 is provided between the pinning layer 55 and the upper electrode E2. In this example, the strain sensing element 50c is different from the strain sensing element 50 shown in FIG. 7 in having a top spin valve structure.

The foundation layer 54 is made of e.g. Ta/Cu. The thickness of this Ta layer is e.g. 3 nm. The thickness of this Cu layer is e.g. 5 nm.

The magnetization free layer 51 is made of e.g. $Co_{40}Fe_{40}B_{20}$ (4 nm).

The intermediate layer 53 is e.g. an MgO layer having a thickness of 1.6 nm.

The first magnetization fixed layer 52 is made of e.g. $Co_{40}Fe_{40}B_{20}/Fe_{50}Co_{50}$. The thickness of this $Co_{40}Fe_{40}B_{20}$ layer is e.g. 2 nm. The thickness of this $Fe_{50}Co_{50}$ layer is e.g. 1 nm.

The magnetic coupling layer 57 is e.g. a Ru layer having a thickness of 0.9 nm.

The second magnetization fixed layer 56 is e.g. a $Co_{75}Fe_{25}$ layer having a thickness of 2.5 nm.

The pinning layer 55 is e.g. an IrMn layer having a thickness of 7 nm.

The cap layer 58 is made of Ta/Ru. The thickness of this Ta layer is e.g. 1 nm. The thickness of this Ru layer is e.g. 5 nm.

In the strain sensing element 50c of the top spin valve type of the aforementioned example, the first magnetization fixed layer (second magnetic layer) 52 is formed below (on the −Z-axis side of) the magnetization free layer (first magnetic layer) 51. The material of each layer included in the strain sensing element 50c can be based on the vertically inverted structure. The diffusion prevention layer described with reference to the strain sensing element 50 shown in FIG. 7 can also be provided between the foundation layer 54 and the magnetization free layer 51 in the strain sensing element 50c of FIG. 9A.

As shown in FIG. 9B, the strain sensing element 50d used in the embodiment includes a lower electrode E1, a foundation layer 54, a pinning layer 55, a first magnetization fixed layer (second magnetic layer) 52, an intermediate layer 53, a magnetization free layer (first magnetic layer) 51, a cap layer 58, and an upper electrode E2. The foundation layer 54 is provided between the lower electrode E1 and the upper electrode E2. The pinning layer 55 is provided between the foundation layer 54 and the upper electrode E2. The first magnetization fixed layer 52 is provided between the pinning layer

55 and the upper electrode E2. The intermediate layer 53 is provided between the first magnetization fixed layer 52 and the upper electrode E2. The magnetization free layer 51 is provided between the intermediate layer 53 and the upper electrode E2. The cap layer 58 is provided between the magnetization free layer 51 and the upper electrode E2.

The strain sensing elements described above are based on the structure using the first magnetization fixed layer 52, the magnetic coupling layer 57, and the second magnetization fixed layer 56. The strain sensing element 50d shown in FIG. 9B is based on a single pinned structure using a single magnetization fixed layer.

The foundation layer 54 is made of e.g. Ta/Ru. The thickness of this Ta layer is e.g. 3 nm. The thickness of this Ru layer is e.g. 2 nm.

The pinning layer 55 is e.g. an IrMn layer having a thickness of 7 nm.

The first magnetization fixed layer 52 is e.g. a $Co_{40}Fe_{40}B_{20}$ layer having a thickness of 3 nm.

The intermediate layer 53 is e.g. an MgO layer having a thickness of 1.6 nm.

The magnetization free layer 51 is made of e.g. $Co_{40}Fe_{40}B_{20}$ (4 nm).

The cap layer 58 is made of Ta/Ru. The thickness of this Ta layer is e.g. 1 nm. The thickness of this Ru layer is e.g. 5 nm.

Also in the aforementioned strain sensing element 50d of the single pinned type, the material of each layer included in the strain sensing element can be made similar to the material described with reference to the strain sensing element 50 of FIG. 7.

As shown in FIG. 9C, the strain sensing element 50e used in the embodiment includes a lower electrode E1, a foundation layer 54, a lower pinning layer 55a, a lower second magnetization fixed layer 56a, a lower magnetic coupling layer 57a, a lower first magnetization fixed layer (second magnetic layer) 52a, a lower intermediate layer 53a, a magnetization free layer (first magnetic layer) 51, an upper intermediate layer 53b, an upper first magnetization fixed layer (second magnetic layer) 52b, an upper magnetic coupling layer 57b, an upper second magnetization fixed layer 56b, an upper pinning layer 55b, a cap layer 58, and an upper electrode E2.

The foundation layer 54 is provided between the lower electrode E1 and the upper electrode E2. The lower pinning layer 55a is provided between the foundation layer 54 and the upper electrode E2. The lower second magnetization fixed layer 56a is provided between the lower pinning layer 55a and the upper electrode E2. The lower magnetic coupling layer 57a is provided between the lower second magnetization fixed layer 56a and the upper electrode E2. The lower first magnetization fixed layer (second magnetic layer) 52a is provided between the lower magnetic coupling layer 57a and the upper electrode E2. The lower intermediate layer 53a is provided between the lower first magnetization fixed layer (second magnetic layer) 52a and the upper electrode E2. The magnetization free layer (first magnetic layer) 51 is provided between the lower intermediate layer 53a and the upper electrode E2. The upper intermediate layer 53b is provided between the magnetization free layer (first magnetic layer) 51 and the upper electrode E2. The upper first magnetization fixed layer (second magnetic layer) 52b is provided between the upper intermediate layer 53b and the upper electrode E2. The upper magnetic coupling layer 57b is provided between the upper first magnetization fixed layer (second magnetic layer) 52b and the upper electrode E2. The upper second magnetization fixed layer 56b is provided between the upper magnetic coupling layer 57b and the upper electrode E2. The upper pinning layer 55b is provided between the upper second magnetization fixed layer 56b and the upper electrode E2. The cap layer 58 is provided between the upper pinning layer 55b and the upper electrode E2.

The foundation layer 54 is made of e.g. Ta/Ru. The thickness (length in the Z-axis direction) of this Ta layer is e.g. 3 nanometers (nm). The thickness of this Ru layer is e.g. 2 nm.

The lower pinning layer 55a is e.g. an IrMn layer having a thickness of 7 nm.

The lower second magnetization fixed layer 56a is e.g. a $Co_{75}Fe_{25}$ layer having a thickness of 2.5 nm.

The lower magnetic coupling layer 57a is e.g. a Ru layer having a thickness of 0.9 nm.

The lower first magnetization fixed layer 52a is e.g. a $Co_{40}Fe_{40}B_{20}$ layer having a thickness of 3 nm.

The lower intermediate layer 53a is e.g. an MgO layer having a thickness of 1.6 nm.

The magnetization free layer 51 is made of e.g. $Co_{40}Fe_{40}B_{20}$ having a thickness of 4 nm.

The upper intermediate layer 53b is e.g. an MgO layer having a thickness of 1.6 nm. The upper first magnetization fixed layer 52b is made of e.g. $Co_{40}Fe_{40}B_{20}Fe_{50}Co_{50}$. The thickness of this $Co_{40}Fe_{40}B_{20}$ layer is e.g. 2 nm. The thickness of this $Fe_{50}Co_{50}$ layer is e.g. 1 nm.

The upper magnetic coupling layer 57b is e.g. a Ru layer having a thickness of 0.9 nm.

The upper second magnetization fixed layer 56b is e.g. a $Co_{75}Fe_{25}$ layer having a thickness of 2.5 nm.

The upper pinning layer 55b is e.g. an IrMn layer having a thickness of 7 nm.

The cap layer 58 is made of e.g. Ta/Ru. The thickness of this Ta layer is e.g. 1 nm. The thickness of this Ru layer is e.g. 5 nm.

Also in the aforementioned strain sensing element 50e, the material of each layer included in the strain sensing element 50e can be made similar to the material described with reference to the strain sensing element 50 of FIG. 7.

As shown in FIG. 9D, the strain sensing element 50f used in the embodiment includes a lower electrode E1, a foundation layer 54, a first magnetization free layer (first magnetic layer) 51a, an intermediate layer 53, a second magnetization free layer (second magnetic layer) 51b, a cap layer 58, and an upper electrode E2. The foundation layer 54 is provided between the lower electrode E1 and the upper electrode E2. The first magnetization free layer 51a is provided between the foundation layer 54 and the upper electrode E2. The intermediate layer 53 is provided between the first magnetization free layer 51a and the upper electrode E2. The second magnetization free layer 51b is provided between the intermediate layer 53 and the upper electrode E2. The cap layer 58 is provided between the second magnetization free layer 51b and the upper electrode E2.

The strain sensing elements described above are based on the structure using the first magnetization fixed layer 52 and the magnetization free layer 51. The strain sensing element 50f shown in FIG. 9D is based on a two-layer free structure using two magnetization free layers.

The foundation layer 54 is made of e.g. Ta/Cu. The thickness of this Ta layer is e.g. 3 nm. The thickness of this Cu layer is e.g. 5 nm.

The first magnetization free layer 51a is e.g. a $Co_{40}Fe_{40}B_{20}$ layer having a thickness of 4 nm.

The intermediate layer 53 is e.g. an MgO layer having a thickness of 1.6 nm.

The second magnetization free layer 51b is made of e.g. $Co_{40}Fe_{40}B_{20}$ (4 nm).

The cap layer 58 is made of Cu/Ta/Ru. The thickness of this Cu layer is e.g. 5 nm. The thickness of this Ta layer is e.g. 1 nm. The thickness of this Ru layer is e.g. 5 nm.

Also in the aforementioned two-layer free structure, the material of each layer included in the strain sensing element 50f can be made similar to the material described with reference to the strain sensing element 50 of FIG. 7.

Figure 10:
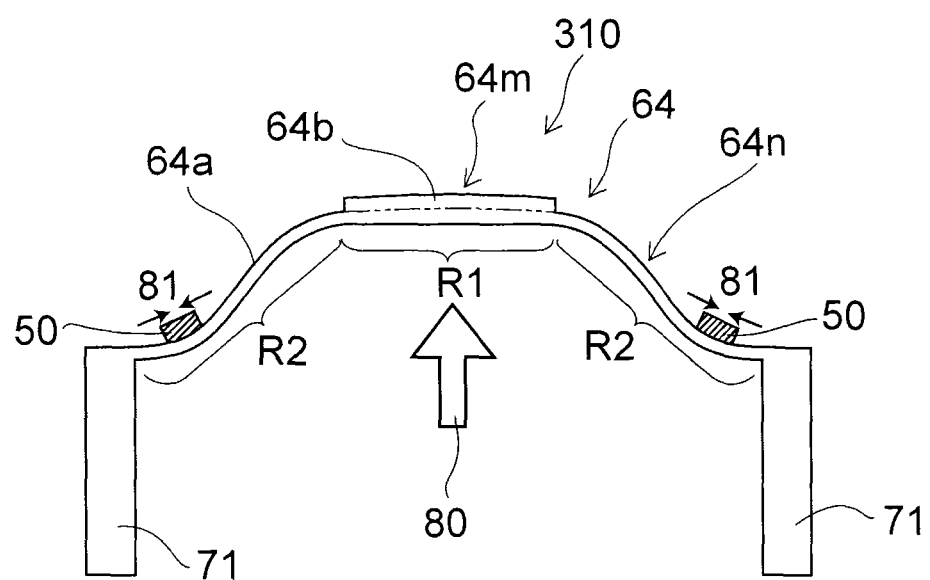
FIG. 10 is a schematic sectional view illustrating the function of the pressure sensor of the first embodiment.

FIG. 10 is a schematic sectional view illustrating the function of the pressure sensor of the first embodiment.

FIG. 10 is a sectional view taken along line A1-A2 of FIG. 1A.

The end of the film section 64 is joined to the support section 71. Thus, as shown in FIG. 10, when an external pressure 80 is applied so that the vicinity of the center of the film section 64 is made convex, a compressive stress is applied by the strain 81 to the strain sensing element 50 placed at the film section end. When an external pressure 80 is applied so that the film section 64 is made concave, a tensile stress is applied to the strain sensing element 50 placed at the film section end.

When a strain 81 generated by warpage of the film section 64 is applied to the strain sensing element 50, the MR effect is produced by the inverse magnetostriction effect as described above. The pressure sensor 310 works by reading as a signal the change of electrical resistance of the strain sensing element 50 generated by the MR effect.

For a larger strain 81, the change of electrical resistance of the strain sensing element 50 is larger. Thus, the sensitivity of the pressure sensor 310 can be enhanced by providing the film section 64 with such a shape that a large strain 81 is generated in response to the external pressure 80. The thickness of the central part 64m of the film section 64 is thicker than the thickness of the peripheral part 64n of the film section 64. The hardness of the central part 64m of the film section 64 is harder than the hardness of the peripheral part 64n of the film section 64. Thus, the strain is less likely to occur in the central part 64m. The strain concentrates near the support section 71 end where the strain sensing element 50 is placed. As a result, the strain 81 is larger than in the case where there is no difference in thickness between the central part 64m of the film section 64 and the peripheral part 64n of the film section 64.

FIGS. 11A and 11B are schematic sectional views showing the displacement of the film section when the film section of the pressure sensor of the first embodiment is warped convexly to the outside.

FIGS. 11A and 11B are sectional views taken along line A1-A2 of FIG. 1A.

FIG. 11B shows the case where the ratio of the area of the second film 64b of the film section 64 to the total area of the film section 64 is larger than that of FIG. 11A. In other words, FIG. 11B shows the case where the ratio of the area of the first region R1 to the total area of the first film 64a is larger than that of FIG. 11A. In order to simply show that the central part 64m is less prone to strain than the peripheral part 64n, the central part 64m in the figure is depicted in a flat state without strain. Furthermore, the displacement L of the center of the film section 64 from the initial state is slightly different between FIG. 11A and FIG. 11B. However, the displacement L is equally depicted for simplicity in FIG. 11A and FIG. 11B.

Comparing FIG. 11A with FIG. 11B, the curvature of the film at the position where the strain sensing element 50 is placed (in this example, the second region R2 of the first film 64a) is larger in FIG. 11B. This indicates that the strain 81 generated by the strain of the film section 64 is larger in FIG. 11B than in FIG. 11A. The distance from the barycenter of the film section 64 to the boundary 64c between the first region R1 of the first film 64a and the second region R2 of the first film 64a is denoted as distance a. The distance from the barycenter of the film section 64 to the nearest end of the support section 71 is denoted as distance b. The ratio (a/b) of the distance a to the distance b can be set to 0.5 or more and 0.97 or less. In this case, preferably, the ratio can be set to 0.6 or more and 0.93 or less.

Figure 12:
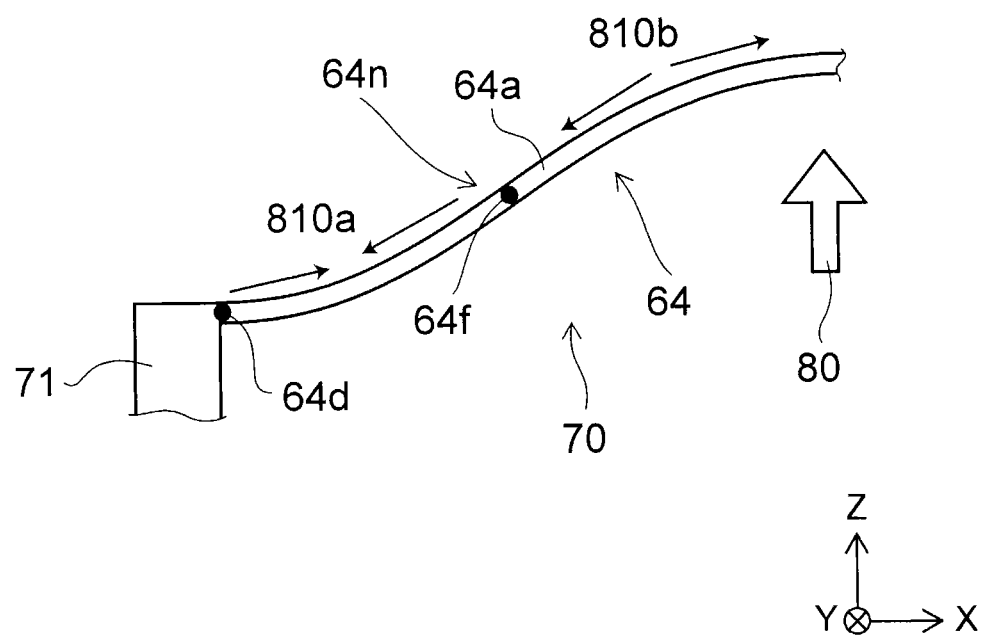
FIG. 12 is a schematic sectional view for describing the distribution of the stress generated in the film section when an external pressure is applied to the pressure sensor of the first embodiment.

FIG. 12 is a schematic sectional view for describing the distribution of the stress generated in the film section when an external pressure is applied to the pressure sensor of the first embodiment.

As shown in FIG. 12, an external pressure 80 is applied from the cavity section 70 side. In this case, the film section 64 is warped convexly around the central part because the film section 64 is fixed at the support section 71 end. The film section 64 is warped concavely near the support section 71. Thus, the direction of the strain applied to the film section 64 is inverted at a point 64f near the support section 71 (see the strain 810a and the strain 810b shown in FIG. 12).

In order to apply a large stress to the strain sensing element 50, the strain sensing element 50 needs to be placed between the point 64d and the point 64f. The point 64d is a boundary point between the film section 64 and the support section 71, or the point where the film section 64 is connected to the support section 71. The spacing between the point 64d and the point 64f is relatively short. In FIG. 11B, the ratio of the area of the first region R1 to the area of the first film 64a is large, and the strain 810a is large. In this case, the spacing between the point 64d and the point 64f is shorter. Thus, a strain sensing element based on a typical piezoelectric element is difficult to place between the point 64d and the point 64f. In contrast, the strain sensing element 50 of the embodiment is superior in spatial resolution. Thus, the strain sensing element 50 can be placed between the point 64d and the point 64f.

Figure 13:
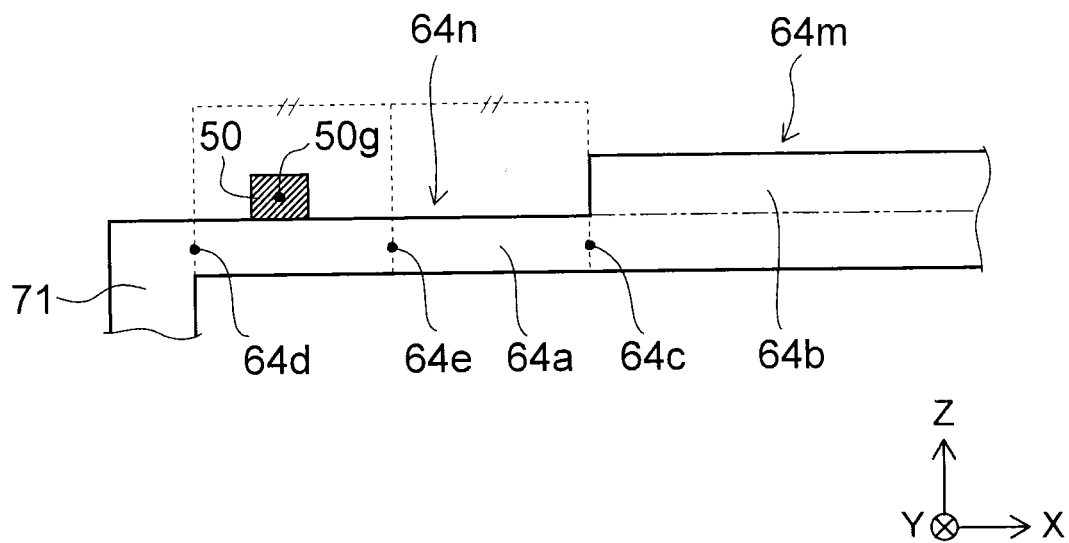
FIG. 13 is a schematic sectional view showing the placement position of the strain sensing element on the film section of the pressure sensor of the first embodiment.

FIG. 13 is a schematic sectional view showing the placement position of the strain sensing element on the film section of the pressure sensor of the first embodiment.

In order to apply a large strain 81 to the strain sensing element 50, for instance, the strain sensing element 50 is placed so that the barycenter 50g of the strain sensing element 50 is located between the center point 64e and the point 64d (end part) of the support section 71. The center point 64e is the center point of the straight line connecting the boundary 64c between the first region R1 of the first film 64a and the second region R2 of the first film 64a to the point 64d (end part) of the support section 71 nearest to the boundary 64c. Preferably, the strain sensing element 50 is placed so as to be entirely fitted between the center point 64e and the point 64d of the support section 71. This placement position of the strain sensing element 50 also applies to the other embodiments.

Manufacturing Process of the First Embodiment

Next, a method for manufacturing a pressure sensor of the first embodiment is described.

Figure 14:
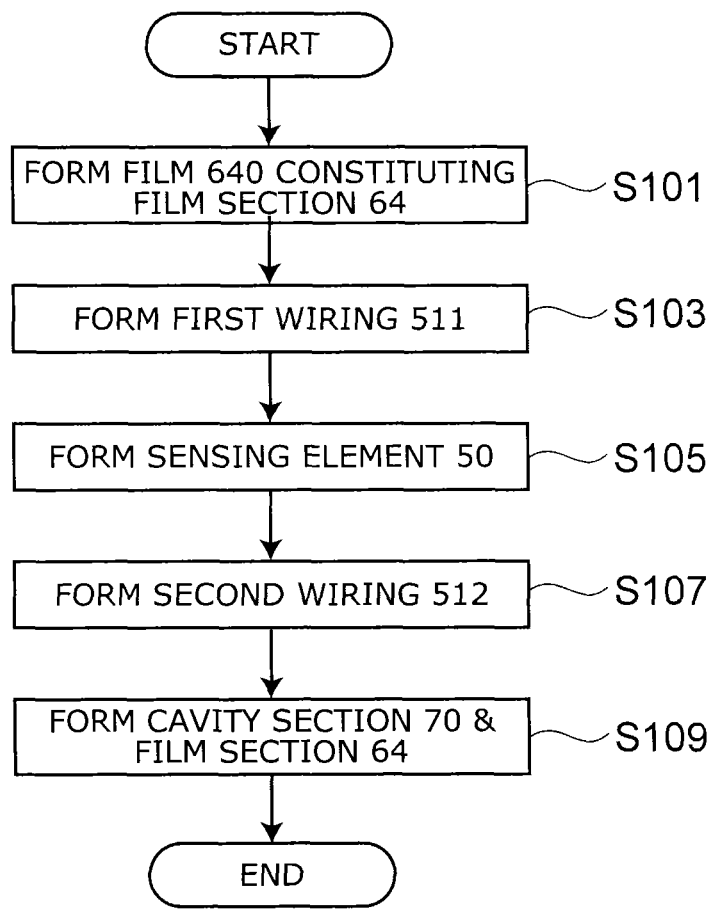
FIG. 14 is a flow chart illustrating the method for manufacturing a pressure sensor according to the first embodiment.

FIG. 14 is a flow chart illustrating the method for manufacturing a pressure sensor according to the first embodiment.

FIGS. 15A to 15D are schematic process views illustrating the method for manufacturing a pressure sensor.

FIGS. 16A to 16D are schematic process views for forming a pressure sensor including the film section of FIG. 2A among the pressure sensors of the first embodiment.

FIGS. 17A to 17D are schematic process views for forming a pressure sensor including the film section of FIG. 2B among the pressure sensors of the first embodiment.

In FIGS. 15A to 15D, for clarity of illustration, the shape and size of each component are appropriately changed from those of FIG. 1A. The shape of the film section 64 is assumed to be circular.

Figure 15A:
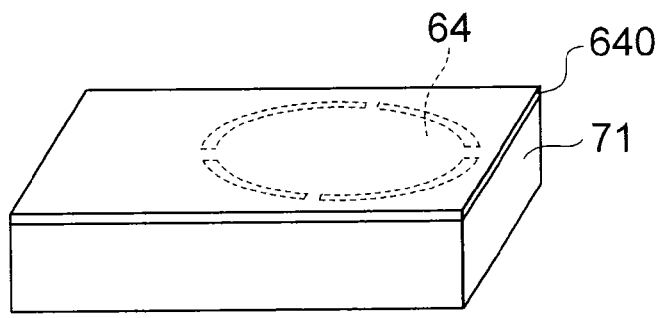
FIGS. 15A to 15D are schematic process views illustrating the method for manufacturing a pressure sensor.
Figure 16A:
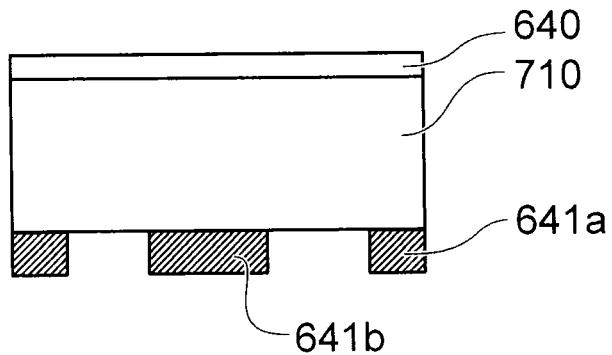
FIGS. 16A to 16D are schematic process views for forming a pressure sensor including the film section of FIG. 2A among the pressure sensors of the first embodiment.

As shown in FIGS. 14, 15A, and 16A, a film 640 constituting a film section 64 is formed (step S101). The film 640 is formed on a substrate 710 constituting a base section 71. The substrate 710 is e.g. a silicon substrate.

Figure 15B:
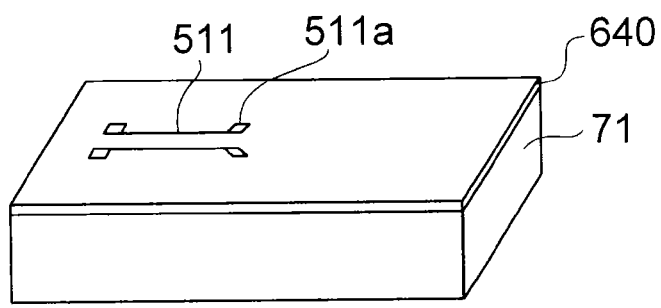

As shown in FIGS. 14 and 15B, a first wiring 511 is formed (step S103). For instance, as shown in FIG. 15B, a conductive film is formed on the film 640. This conductive film is processed into a prescribed shape to form a first wiring 511. In FIG. 15B, for clarity of illustration, some of a plurality of first wirings 511 are depicted.

Figure 15C:
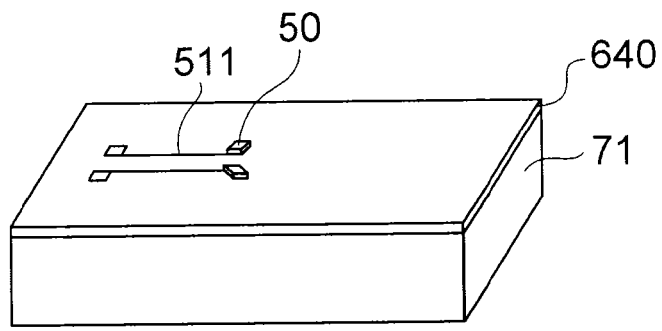

As shown in FIGS. 14 and 15C, a sensing element 50 is formed (step S105). For instance, as shown in FIG. 15C, a cavity section 70 of the first wiring 511 is formed. Then, a sensing element 50 is formed on the portion 511a (see FIG. 15B) located on the film section 64. Films constituting the sensing element 50 are sequentially formed to form a stacked film. This stacked film is processed into a prescribed shape to form a sensing element 50.

Figure 15D:
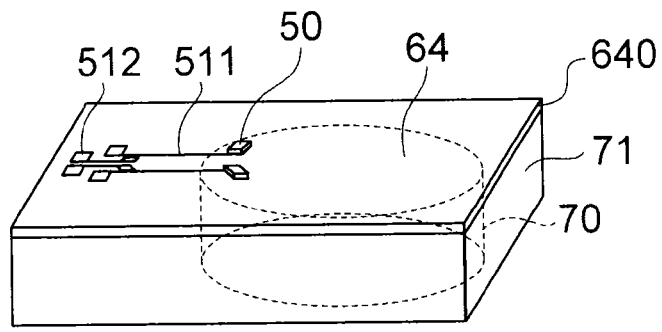

As shown in FIGS. 14 and 15D, a second wiring 512 is formed (step S107). For instance, as shown in FIG. 15D, an insulating film, not shown, is formed so as to cover the sensing element 50. Part of this insulating film is removed to expose the upper surface of the sensing element 50. A conductive film is formed thereon and processed into a prescribed shape to form a second wiring 512.

At least part of steps S101-S107 may be performed simultaneously or in a different order as long as technically feasible.

Next, as shown in FIGS. 14, 16A to 17D, a cavity section 70 and a film section 64 are formed (step S109). In the case of forming the film section 64 of FIG. 2C, both the steps of FIGS. 16A to 16D and FIGS. 17A to 17D are used. For clarity of illustration, the first wiring 511, the second wiring 512, and the sensing element 50 are not shown. The film 640 constituting the film section 64 and the substrate 710 are shown.

FIG. 16A is a schematic sectional view. In FIG. 16A, a mask 641a and a mask 641b are formed on the surface of the substrate 710 different from the surface on which the film 640 is formed.

The mask 641a covers the portion of the substrate 710 constituting a base section 71 after processing. The mask 641b is formed on the portion of the film 640 across the substrate 710, the portion constituting the first region R1 after processing.

Figure 16B:
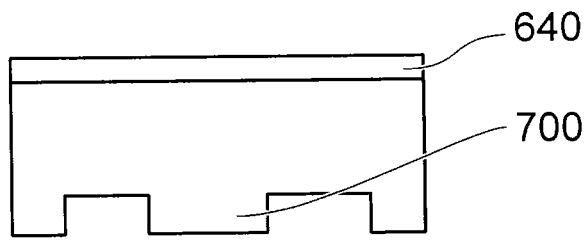

FIG. 16B is a schematic sectional view. In FIG. 16B, the substrate 710 is etched for a fixed time from the state of FIG. 16A. Then, the mask 641a and the mask 641b are removed.

At this time, a projection 700 resulting from the mask 614b is formed in the substrate 710 as shown in FIG. 16B.

Figure 16C:
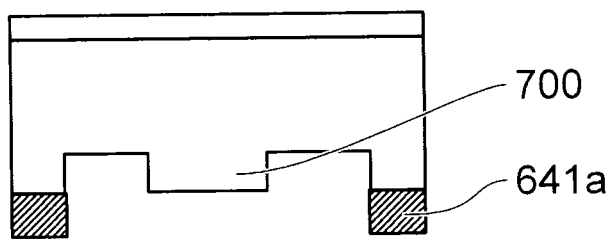

FIG. 16C is a schematic sectional view. In FIG. 16C, a mask 614a is formed again from the state of FIG. 16B.

Figure 16D:
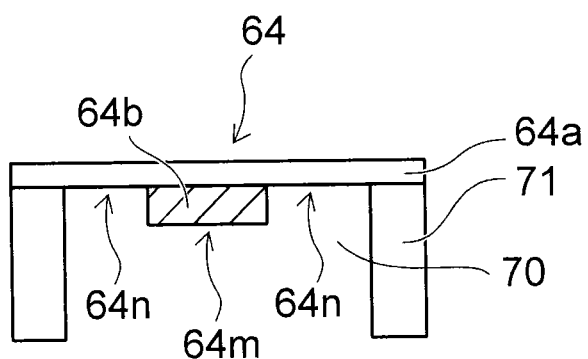

FIG. 16D is a schematic sectional view. In FIG. 16D, etching is performed again from the state of FIG. 16C in which the mask 614a has been formed. Thus, the substrate 710 is etched until the film 640 is exposed in the portion where the projection 700 does not exist. Then, the mask 614a is removed.

At this time, the film 640 constitutes a first film 64a. The projected shape resulting from the projection 700 constitutes a second film 64b. As a result, a central part 64m and a peripheral part 64n are formed in the film section 64.

Figure 17A:
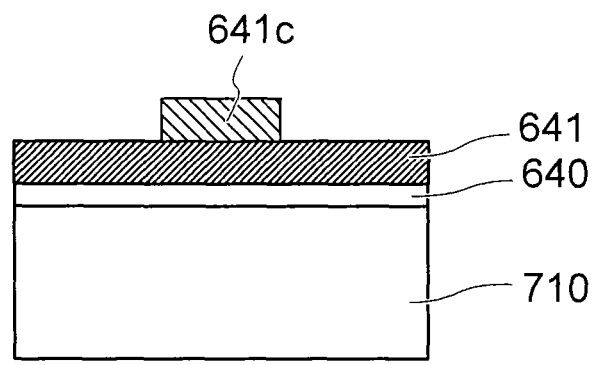
FIGS. 17A to 17D are schematic process views for forming a pressure sensor including the film section of FIG. 2B among the pressure sensors of the first embodiment.

FIG. 17A is a schematic sectional view. In FIG. 17A, a film 641 is formed on the film 640 formed on the base section 710. A mask 641c is formed on the film 641.

The mask 641c is formed on the portion of the film section 64 constituting the first region R1.

Figure 17B:
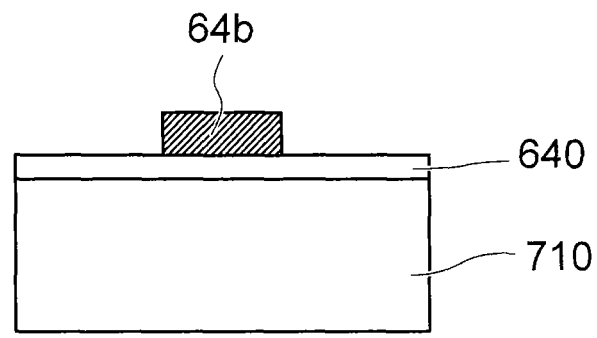

FIG. 17B is a schematic sectional view. In FIG. 17B, the film 641 is etched from the state of FIG. 17A. After exposing the film 640, the mask 641c is removed.

Only the portion of the film 641 covered with the mask 641c remains. Thus, a second film 64b is formed.

Figure 17C:
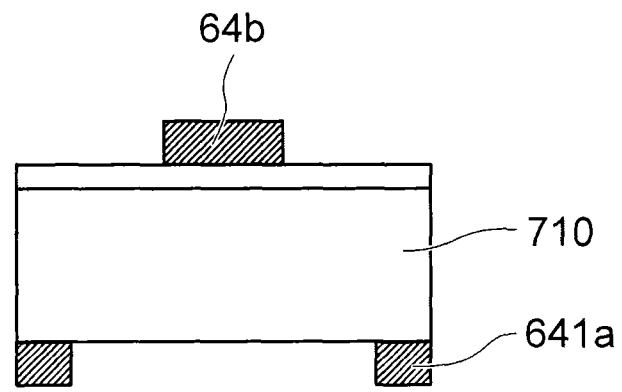

FIG. 17C is a schematic sectional view. In FIG. 17C, a mask 641a is formed on the surface of the base section 710 different from the surface on which the film 640 is formed.

The mask 641a covers the portion of the substrate 710 constituting a base section 71 after processing.

Figure 17D:
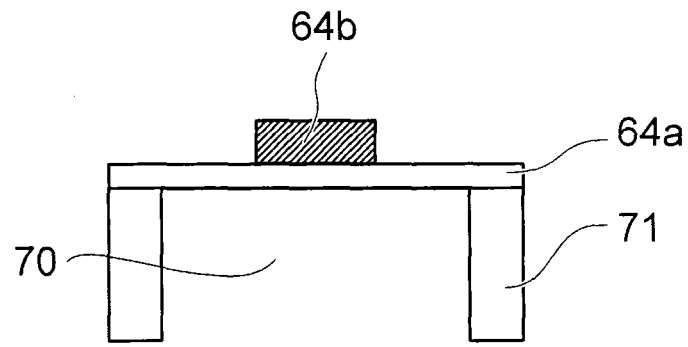

FIG. 17D is a schematic sectional view. In FIG. 17D, the substrate 710 is etched until the film 640 is exposed from the state of FIG. 17C.

After processing, the film 640 constitutes a first film 64a. The steps of FIGS. 17A to 17D may be performed simultaneously or in a different order as long as technically feasible.

In FIGS. 17A and 17B, after the film 641 is formed, the second film 64b is formed by trimming an unnecessary portion. However, the film 640 may be covered with a mask outside the portion on which the second film 64b is formed. Thus, the second film 64b may be formed by removing the mask after forming the film 641.

Step S109 shown in FIG. 14 may be performed during steps S101-S107 as long as technically feasible. At least part of steps S101-S107 may be performed simultaneously or in a different order as long as technically feasible.

Etching processing can be performed by e.g. the deep RIE process (deep reactive ion etching process) or Bosch process.

The fixation of the magnetization 120a of the magnetization fixed layer by annealing (step S111) may be performed at any timing after forming the stacked film by sequentially forming the films constituting the sensing element 50. However, preferably, the fixation is performed before processing the stacked film into a prescribed shape.

Second Embodiment

Figure 18:
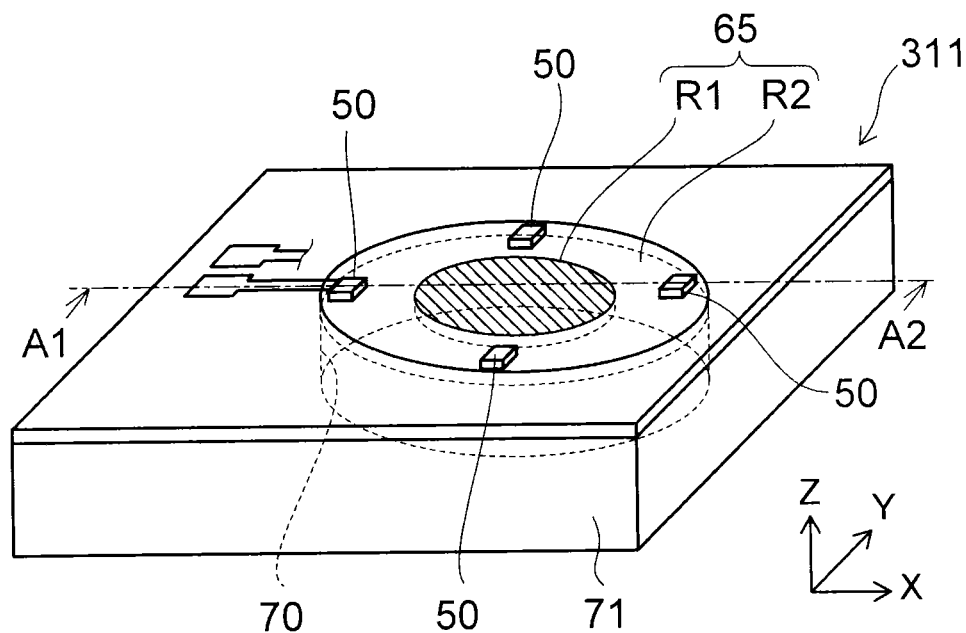
FIG. 18 is a schematic perspective view illustrating a pressure sensor according to a second embodiment.

FIG. 18 is a schematic perspective view illustrating a pressure sensor according to a second embodiment.

In FIG. 18, for clarity of illustration, insulating parts are not shown, and conductive parts are primarily depicted. Furthermore, for clarity of illustration, some of the strain sensing elements 50 are depicted. Furthermore, as described later, the material of the first region R1 in the central part of the film section 65 is different from the material of the second region R2 in the peripheral part of the film section 65. In the figure, the difference in the material of the film is represented using e.g. hatching.

The structure of the pressure sensor 311 of the second embodiment other than the film section 65 is similar to the structure of the pressure sensor 310 of the first embodiment other than the film section 64. The film section 65 of the pressure sensor 311 of the second embodiment corresponds to the film section 64 of the pressure sensor 310 of the first embodiment.

Figure 19:
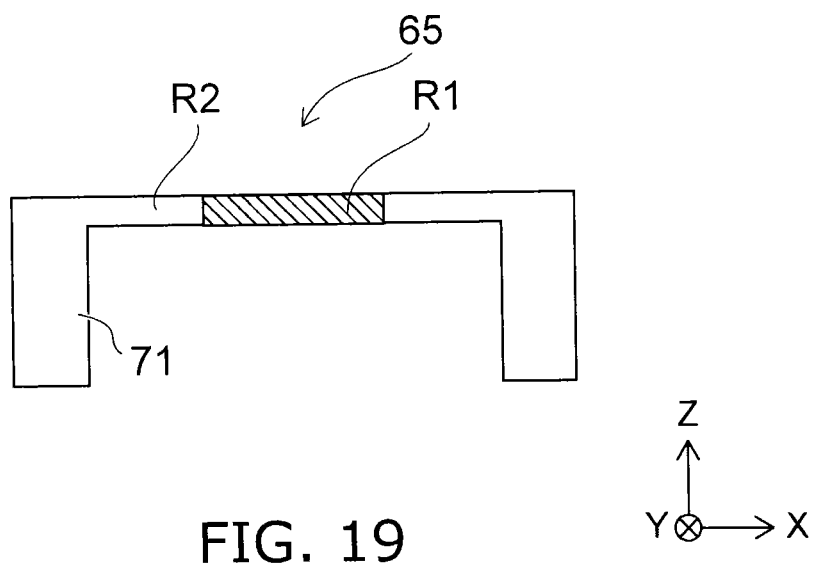
FIG. 19 is a schematic sectional view illustrating the pressure sensor according to the second embodiment.

FIG. 19 is a schematic sectional view illustrating the pressure sensor according to the second embodiment.

In FIG. 19, for clarity of illustration, insulating parts and conductive parts are not shown. The material of the first region R1 of the film section 65 is different from the material of the second region R2 of the film section 65.

The stress generated in the film section 65 during the process for manufacturing the pressure sensor 311 may remain after manufacturing. In this case, the value of the stress remaining in the first region R1 of the film section 65 is different from the value of the stress remaining in the second region R2 of the film section 65. More specifically, the value of the stress remaining in the first region R1 of the film section 65 is relatively more tensile than the value of the stress remaining in the second region R2 of the film section 65. Here, the residual stress of the film section is defined to have a negative value if it is compressive, and to have a positive value if it is tensile, around the value "0 (zero)". The state in which the value of the stress remaining in the first region R1 is relatively more tensile than the value of the stress remaining in the second region R2 indicates that subtraction of the value of the stress remaining in the second region R2 from the value of the stress remaining in the first region R1 results in a positive value.

Alternatively, the Young's modulus of the first region R1 of the film section 65 is different from the Young's modulus of the second region R2 of the film section 65. More specifically, the Young's modulus of the first region R1 of the film section 65 is larger than the Young's modulus of the second region R2 of the film section 65.

The thickness of the film section 65 can be set to e.g. 50 nm or more and 3 μm or less. In this case, preferably, the thickness of the film section 65 can be set to 200 nm or more and 1.5 μm or less. In the case where the planar shape of the film section 65 is circular as shown in FIG. 18, the diameter dimension of the film section 65 can be set to e.g. 1 μm or more and 600 μm or less. In this case, preferably, the diameter dimension of the film section 65 can be set to 60 μm or more and 600 μm or less. In the case where the planar shape of the film section 65 is square, the length of one side of the film section 65 can be set to e.g. 1 μm or more and 650 μm or less. In this case, preferably, the length of one side of the film section 65 can be set to 50 μm or more and 550 μm or less. In the case where the planar shape of the film section 65 is rectangular, the length of the short side of the film section 65 can be set to e.g. 1 μm or more and 500 μm or less. In this case, preferably, the length of the short side of the film section 65 can be set to 50 μm or more and 400 μm or less.

As in the film section 64 described above with reference to FIGS. 5A to 5D, the film section 65 of the embodiment may be circular, elliptic, square, or rectangular. In the case where the film section 65 is shaped like a square or a rectangle, the corners may be sharp or may be curved. The shape of the first region R1 of the film section 65 is preferably equal to the shape of the film section 65. However, the shape of the first region R1 may be different from the shape of the film section 65.

The function of the pressure sensor 311 of the embodiment is as described above with reference to FIG. 10. Here, the film section 65 of the pressure sensor 311 of the second embodiment corresponds to the film section 64 of the pressure sensor 310 of the first embodiment.

Figure 20:
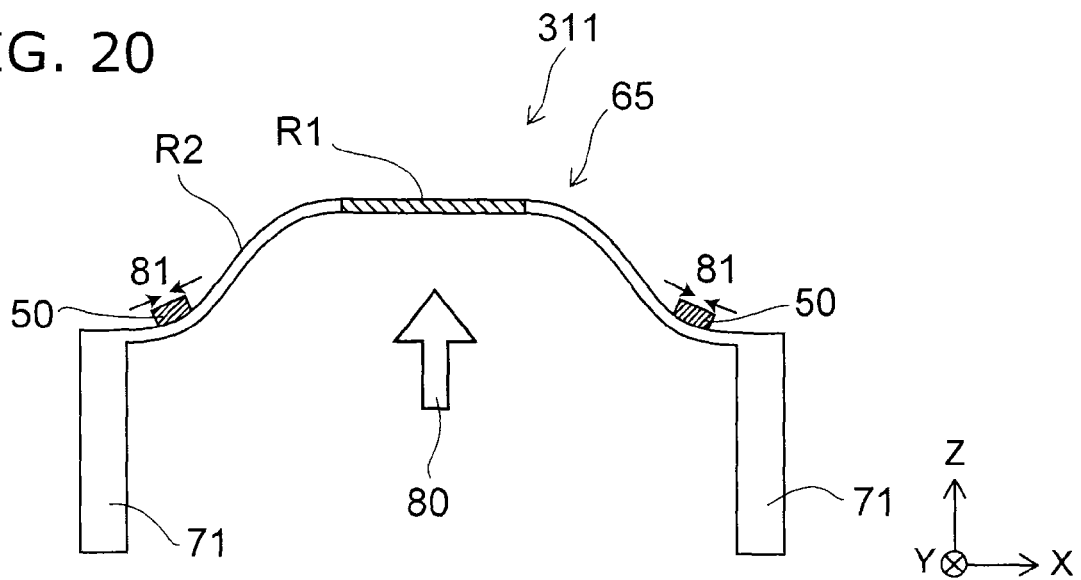
FIG. 20 is a schematic sectional view illustrating the function of the pressure sensor of the second embodiment.

FIG. 20 is a schematic sectional view illustrating the function of the pressure sensor of the second embodiment.

FIG. 20 is a sectional view taken along line A1-A2 of FIG. 18.

The end of the film section 65 is joined to the support section 71. Thus, as shown in FIG. 20, when an external pressure 80 is applied so that the vicinity of the center of the film section 65 is made convex, a compressive stress is applied by the strain 81 to the strain sensing element 50 placed at the film section end. When an external pressure 80 is applied so that the film section 65 is made concave, a tensile stress is applied to the strain sensing element 50 placed at the film section end.

For a larger strain 81, the change of electrical resistance of the strain sensing element 50 is larger. Thus, the sensitivity of the pressure sensor 311 can be enhanced by providing the film section 65 with such a shape that a large strain 81 is generated in response to the external pressure 80. The Young's modulus of the first region R1 of the film section 65 is larger than the Young's modulus of the second region R2 of the film section 65. In other words, the value of the stress remaining in the first region R1 of the film section 65 is larger than the value of the stress remaining in the second region R2 of the film section 65. Thus, the strain is less likely to occur in the first region R1. The strain concentrates near the support section 71 end where the strain sensing element 50 is placed. As a result, the strain 81 is larger than in the case where there is no difference in Young's modulus between the first region R1 of the film section 65 and the second region R2 of the film section 65. In other words, the strain 81 is larger than in the case where there is no difference between the value of the stress remaining in the first region R1 of the film section 65 and the value of the stress remaining in the second region R2 of the film section 65.

Figure 21A:
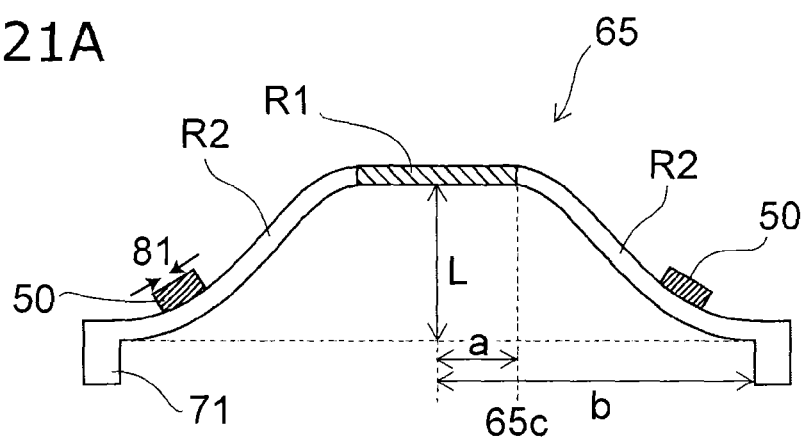
FIGS. 21A and 21B are schematic views showing the displacement of the film section when the film section of the pressure sensor of the second embodiment is warped convexly to the outside.
Figure 21B:
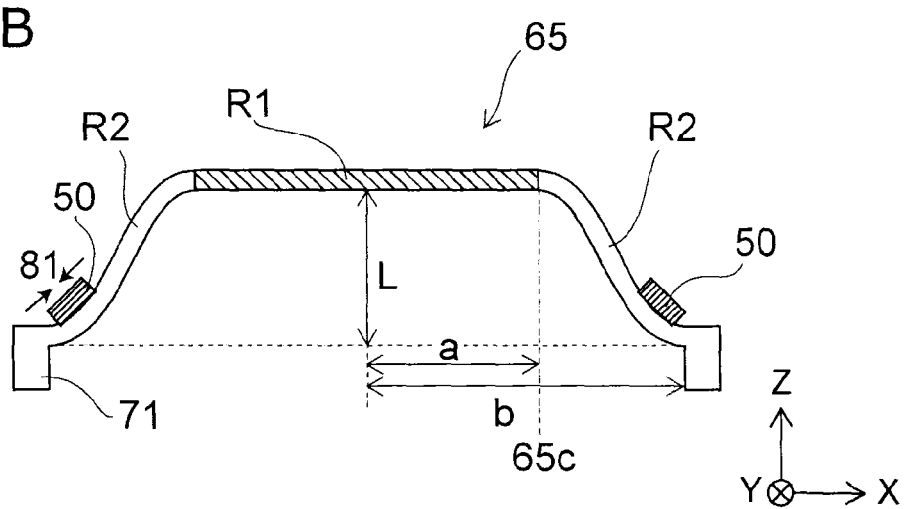

FIGS. 21A and 21B are schematic views showing the displacement of the film section when the film section of the pressure sensor of the second embodiment is warped convexly to the outside.

FIGS. 21A and 21B are sectional views taken along line A1-A2 of FIG. 18.

FIG. 21B shows the case where the ratio of the area of the first region R1 of the film section 65 to the total area of the film section 65 is larger than that of FIG. 21A. In order to simply show that the first region R1 is less prone to strain than the second region R2, the first region R1 in the figure is depicted in a flat state without strain. Furthermore, the displacement L of the center of the film section 65 from the initial state is slightly different between FIG. 21A and FIG. 21B. However, the displacement L is equally depicted for simplicity in FIG. 21A and FIG. 21B.

Comparing FIG. 21A with FIG. 21B, the curvature of the film at the position where the strain sensing element 50 is placed (in this example, the second region R2 of the film section 65) is larger in FIG. 21B. This indicates that the strain 81 generated by the strain of the film section 65 is larger in FIG. 21B than in FIG. 21A. When the external pressure 80 is not applied to the film section 65, the distance from the barycenter of the film section 65 to the boundary 65c between the first region R1 of the film section 65 and the second region R2 of the film section 65 is denoted as distance a. The distance from the barycenter of the film section 65 to the nearest end of the support section 71 is denoted as distance b. The ratio (a/b) of the distance a to the distance b can be set to 0.5 or more and 0.97 or less. In this case, preferably, the ratio can be set to 0.6 or more and 0.93 or less.

The placement position of the strain sensing element 50 of the second embodiment is similar to the placement position of the strain sensing element 50 of the first embodiment. That is, the placement position of the strain sensing element 50 of the second embodiment is as described above with reference to FIGS. 12 and 13. Here, the film section 65 of the pressure sensor 311 of the second embodiment corresponds to the film section 64 of the pressure sensor 310 of the first embodiment.

Manufacturing Process of the Second Embodiment

Next, a method for manufacturing a pressure sensor of the second embodiment is described.

Figure 22:
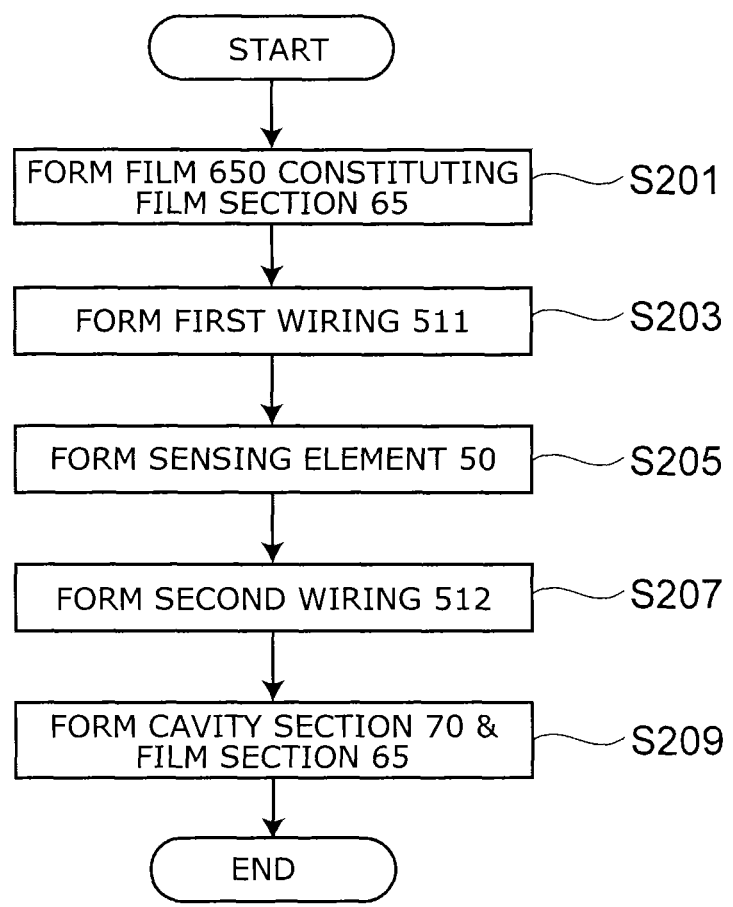
FIG. 22 is a flow chart illustrating the method for manufacturing a pressure sensor according to the second embodiment.

FIG. 22 is a flow chart illustrating the method for manufacturing a pressure sensor according to the second embodiment.

FIGS. 23A to 23D are schematic sectional views for forming a film section using ion implantation technique.

FIGS. 24A to 24D are schematic process views for forming a film section by film formation in a plurality of steps.

Figure 23A:
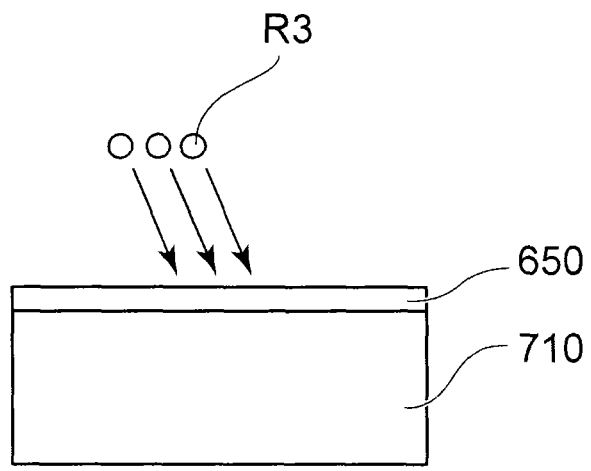
FIGS. 23A to 23D are schematic sectional views for forming a film section using ion implantation technique.
Figure 23B:
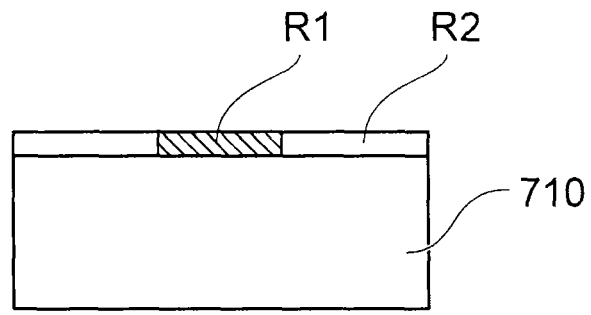

As shown in FIGS. 22 and 23A, a film 650 constituting a film section 65 is formed (step S201). The film 650 is formed on a substrate 710 constituting a base section 71. The substrate 710 is e.g. a silicon substrate. The manufacturing process of steps S103-5107 shown in FIG. 14 also applies to the second embodiment (steps S203-S207).

Next, as shown in FIGS. 22 and FIGS. 23A to 24D, a cavity section 70 and a film section 65 are formed (step S209). For clarity of illustration, the first wiring 511, the second wiring 512, and the sensing element 50 are not shown. The film 650 constituting the film section 65 and the base section 710 are shown.

FIG. 23A is a schematic sectional view showing the step of implanting ions R3 into the film 650 by ion implantation technique.

At this time, ions R3 are implanted into the region constituting the first region R1 of the film section 65 after the completion of the process. As the result of implanting ions R3, the film 650 is divided into a first region R1 and a second region R2 shown in FIG. 23B.

Figure 23C:
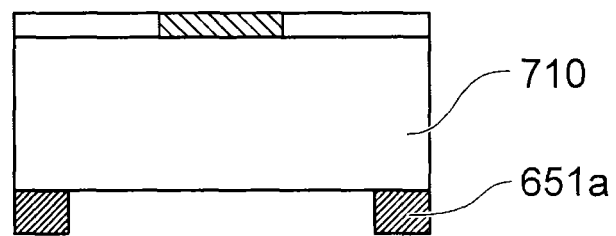

FIG. 23C is a schematic sectional view. In FIG. 23C, a mask 651a is formed on the surface of the base section 710 different from the surface of the film 650.

Etching is performed from the surface on which the mask 651a is formed.

Figure 23D:
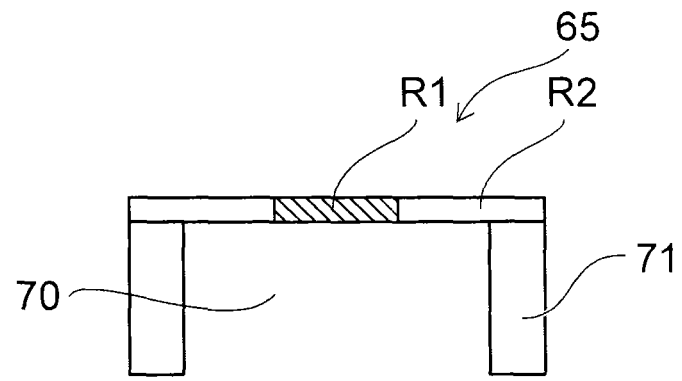

FIG. 23D is a schematic sectional view. In FIG. 23D, etching is performed until the film 650 is exposed.

A cavity section 70 and a support section 71 are formed by etching. The film 650 exposed by etching constitutes a film section 65.

The steps of FIGS. 23A to 23D may be performed simultaneously or in a different order as long as technically feasible.

The ions R3 may be implanted into the region constituting the first region R1 after the completion of the process as shown in FIG. 23A and as described above. Alternatively, the ions R3 may be implanted into the region constituting the second region R2 after the completion of the process.

Etching processing can be performed by e.g. the deep RIE process (deep reactive ion etching process) or Bosch process.

The stress remaining in the film is preferably larger in the first region R1 than in the second region R2. If the volume of the film is reduced by ion implantation into the film, a tensile residual stress is applied to the film. Conversely, if the volume of the film is expanded, a compressive residual stress is applied to the film. Thus, in the case where a film including e.g. Si is used for the film 650, the ions R3 implanted into the first region R1 are typically those of e.g. at least one of hydrogen (H), helium (He), lithium (Li), beryllium (Be), boron (B), carbon (C), nitrogen (N), oxygen (O), fluorine (F), neon (Ne), sodium (Na), magnesium (Mg), and aluminum (Al). In this case, it is preferable to use boron having a valence electron number close to that of silicon. The ions R3 implanted into the second region R2 are those of e.g. at least one of phosphorus (P), sulfur (S), chlorine (Cl), argon (Ar), potassium (K), calcium (Ca), scandium (Sc), titanium (Ti), vanadium (V), chromium (Cr), manganese (Mn), iron (Fe), cobalt (Co), nickel (Ni), copper (Cu), gallium (Ga), germanium (Ge), and arsenic (As). In this case, it is preferable to use phosphorus or arsenic having a valence electron number close to that of silicon. However, the change of the residual stress of the film caused by ion implantation may be positive (tensile) or negative (compressive) by adjusting the ion implantation energy even for the same ions. Thus, the ions implanted into the first region R1 may be implanted into the second region R2.

Besides the stress remaining in the film, the change of the physical quantity of the film caused by ion implantation technique includes the Young's modulus of the film. Thus, ion implantation technique may be used for the purpose of making the Young's modulus of the first region R1 larger than the Young's modulus of the second region R2.

Figure 24A:
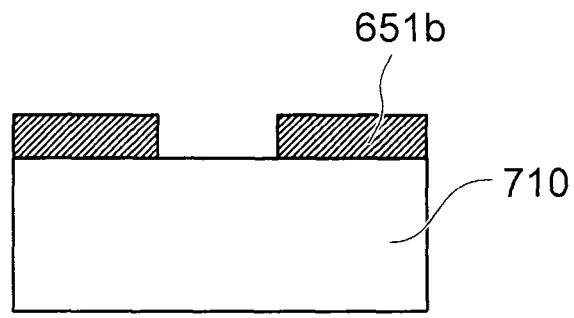
FIGS. 24A to 24D are schematic process views for forming a film section by film formation in a plurality of steps.

FIG. 24A is a schematic sectional view. In FIG. 24A, a mask 651b is formed on the substrate 710 outside the portion constituting the first region R1.

Figure 24B:
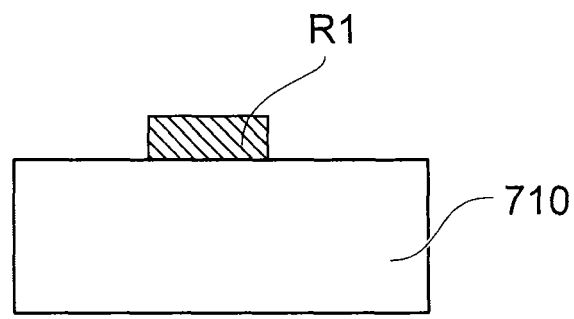

FIG. 24B is a schematic sectional view. In FIG. 24B, a film constituting the first region R1 is formed on the surface on which the mask 651b exists in FIG. 24A. Then, the mask 651b is removed.

The film is formed only on the portion where the mask 651b does not exist. Thus, a first region R1 is formed as shown in the figure.

Figure 24C:
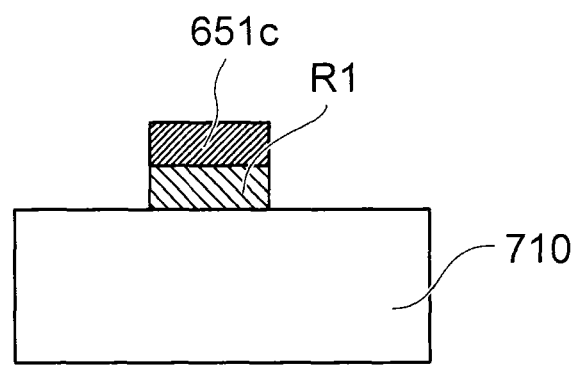

FIG. 24C is a schematic sectional view. In FIG. 24C, a mask 651c is formed on the first region R1.

Figure 24D:
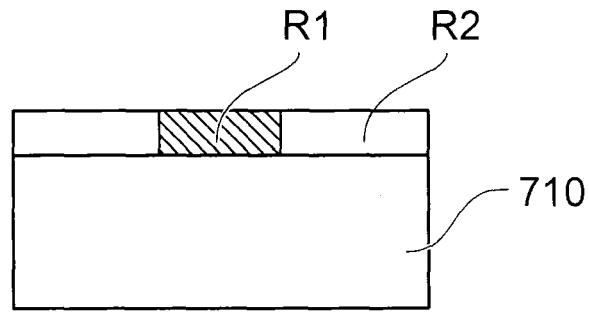

FIG. 24D is a schematic sectional view. In FIG. 24D, a film constituting the second region R2 is formed on the surface on which the mask 651c exists in FIG. 24C. Then, the mask 651c is removed.

The film is formed only on the portion where the mask 651c does not exist. Thus, a second region R2 is formed as shown in the figure.

The steps of FIGS. 24A to 24D may be performed simultaneously or in a different order as long as technically feasible.

The film of the first region R1 is formed not entirely on the substrate, but partly on the substrate. In a method for this purpose, when a mask is formed, only the portion where the film is to be formed is not covered with the mask as shown in FIGS. 24A and 24B. In an alternative method, a film is formed entirely on the substrate, and then the unnecessary portion is removed by etching as shown in FIGS. 17A and 17B.

Either method may be used in the process for manufacturing the film section as long as technically feasible. This also applies to the other embodiments.

The first region R1 and the second region R2 are formed by the method of FIGS. 24A to 24D. Then, the film section 65, the strut section 71, and the space section 70 are formed. The method for this formation is similar to that of FIGS. 23C and 23D.

A film combination of the first region R1 of the film section 65 and the second region R2 of the film section 65 is a combination of a metal film (first region) and an insulator film or semiconductor film (second region). Here, the metal film can be formed from a material such as gold (Au), silver (Ag), copper (Cu), aluminum (Al), and molybdenum (Mo). The insulator film or semiconductor film can be formed from a material such as silicon (Si), silicon oxide, and silicon nitride. In using this combination, amorphous silicon (a-Si), although not a metal, may be used for the film of the first region R1.

An alternative combination is a combination of films having the same composition of atoms constituting the first region R1 and the second region R2, but having different composition ratios. For instance, a silicon nitride (SiN) film may be used in the first region R1 and the second region R2. In this case, the film of the second region R2 is richer in nitrogen (N) than the film of the first region R1 (N-rich=compressive film=second region).

An alternative combination (first combination) is a combination of a pure film of the first region R1 not mixed with impurity, and a film of the second region R2 in which impurity is mixed in the film used in the first region R1. An example of the pure film is made of e.g. silicon. The impurity is at least one of the aforementioned elements of ions implanted into the second region R2.

An alternative combination (second combination) is a combination of a pure film of the second region R2 not mixed with impurity, and a film of the first region R1 in which impurity is mixed in the film used in the second region R2. An example of the pure film is made of e.g. silicon. The impurity is at least one of the aforementioned elements of ions implanted into the first region R1.

An alternative combination is a combination in which the second region R2 is made of the impurity-containing film used for the second region R2 in the aforementioned first combination, and the first region R1 is made of the impurity-containing film used for the first region R1 in the aforementioned second combination.

Third Embodiment

Figure 25:
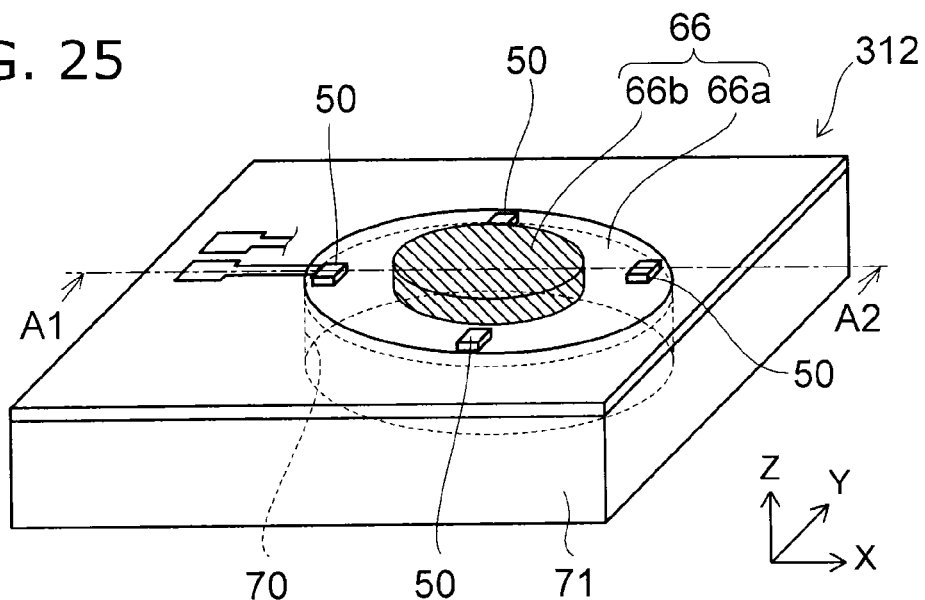
FIG. 25 is a schematic perspective view illustrating a pressure sensor according to a third embodiment.

FIG. 25 is a schematic perspective view illustrating a pressure sensor according to a third embodiment.

In FIG. 25, for clarity of illustration, insulating portions are not shown, and conductive parts are primarily depicted. Furthermore, for clarity of illustration, some of the strain sensing elements 50 are depicted. Furthermore, as described later, the thickness of the central part 66m (see FIGS. 26A to 26C) of the film section 66 is different from the thickness of the peripheral part 66n (see FIGS. 26A to 26C) of the film section 66. Furthermore, the value of the stress remaining in the second film 66b is relatively more tensile than the value of the stress remaining in the first film 66a. Furthermore, the Young's modulus of the second film 66b is larger than the Young's modulus of the first film 66a. In FIG. 25, for clarity of illustration, these differences are represented using e.g. hatching.

The structure of the pressure sensor 312 of the third embodiment other than the film section 66 is similar to the structure of the pressure sensor 310 of the first embodiment other than the film section 64. The film section 66 of the pressure sensor 312 of the third embodiment corresponds to the film section 64 of the pressure sensor 310 of the first embodiment.

Figure 26A:
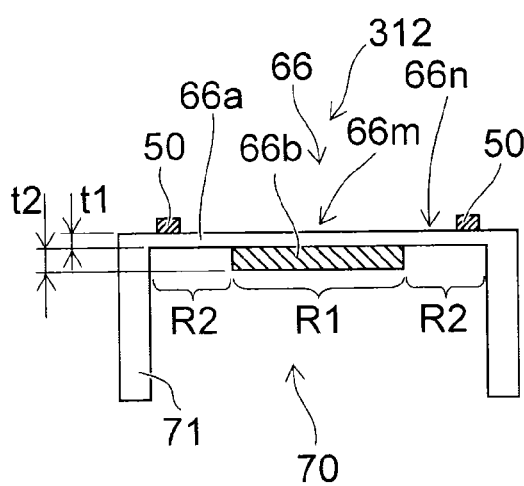
FIGS. 26A to 26C are schematic sectional views illustrating the pressure sensor according to the third embodiment.
Figure 26B:
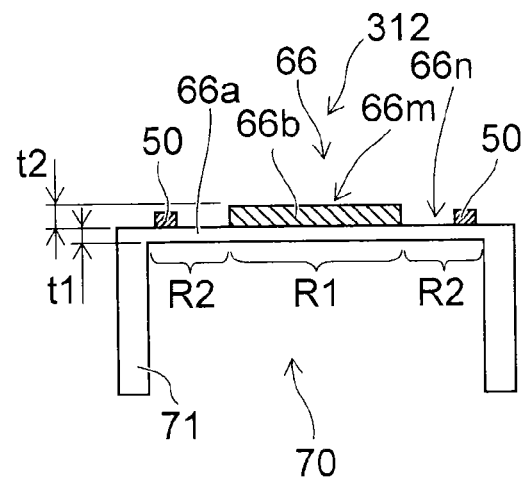
Figure 26C:
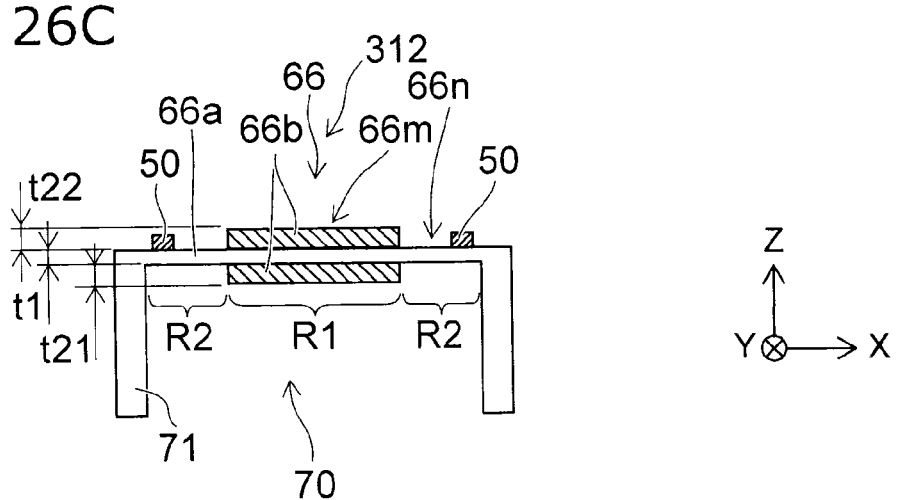

FIGS. 26A to 26C are schematic sectional views illustrating the pressure sensor according to the third embodiment.

FIGS. 26A to 26C are sectional views taken along line A1-A2 of FIG. 25.

In FIGS. 26A to 26C, for clarity of illustration, insulating parts and conductive parts are not shown. The convex shape of the film section 66 may exist on the cavity section 70 side as shown in FIG. 26A. Alternatively, the convex shape of the film section 66 may exist on the opposite side of the film section 66 from the cavity section 70 as shown in FIG. 26B. Alternatively, the convex shape of the film section 66 may exist on both the cavity section 70 side and the opposite side from the cavity section 70 as shown in FIG. 26C.

The film section 66 includes a first film 66a and a second film 66b. The first film 66a includes a first region R1 and a second region R2. The first region R1 is located in a central part 66m of the film section 66. The second region R2 is located in a peripheral part 66n of the film section 66 (peripheral part around the first region R1). The second film 66b is provided on the first region R1. The second film 66b may include a plurality of films formed therein. The thickness of the central part 66m of the film section 66 (the portion of the first region R1 of the first film 66a in combination with the second film 66b) is thicker than the thickness of the peripheral part 66n of the film section 66 (the portion of the second region R2 of the first film 66a).

The stress generated in the film section 66 during the process for manufacturing the pressure sensor 311 may remain after manufacturing. In this case, the value of the stress remaining in the second film 66b is different from the value of the stress remaining in the first film 66a. More specifically, the value of the stress remaining in the second film 66b is larger than the value of the stress remaining in the first film 66a. Here, the residual stress of the film section is compressive if it has a negative value, or tensile if it has a positive value, around the value "0 (zero)".

Alternatively, the Young's modulus of the second film 66b is different from the Young's modulus of the first film 66a. More specifically, the Young's modulus of the second film 66b is larger than the Young's modulus of the first film 66a.

The ratio of the thickness of the central part 66m of the film section 66 (i.e., the total thickness of the thickness t1 of the first film 66a and the thickness t2 of the second film 66b (t21+t22 in the case of FIG. 26C) to the thickness t1 of the peripheral part 66n of the film section 66 (i.e., the thickness t1 of the first film 66a) can be set to e.g. 1.1 times or more and 4 times or less. In this case, preferably, the ratio can be set to 1.5 times or more and 3 times or less. The relationship between the thickness of the central part 66m of the film section 66 and the thickness of the peripheral part 66n of the film section 66 is fitted in the aforementioned range. This sufficiently achieves the undermentioned effect of improving the performance of the sensor resulting from the film thickness difference provided between the central part 66m and the peripheral part 66n. Furthermore, this can suppress the noise of the sensor generated when the pressure sensor 312 is accelerated.

FIGS. 27A to 28C are schematic sectional views illustrating the shape of the film section according to the third embodiment.

Figure 27A:
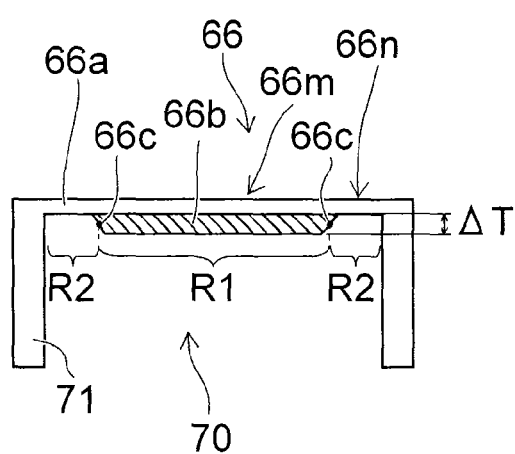
FIGS. 27A to 27C are schematic sectional views illustrating the shape of the film section according to the third embodiment.
Figure 27B:
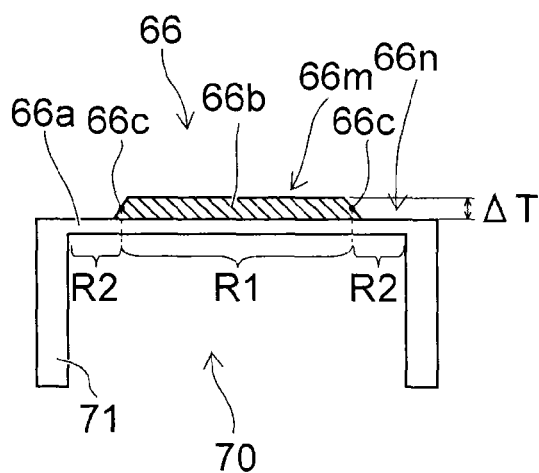
Figure 27C:
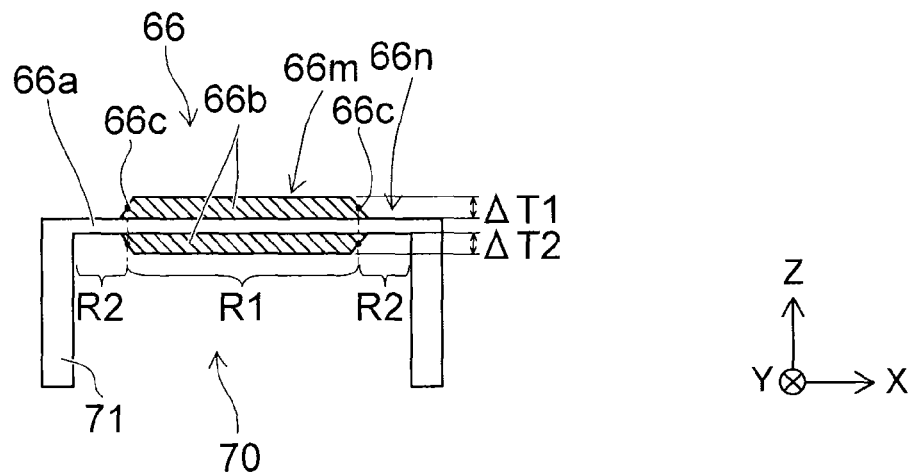
Figure 28A:
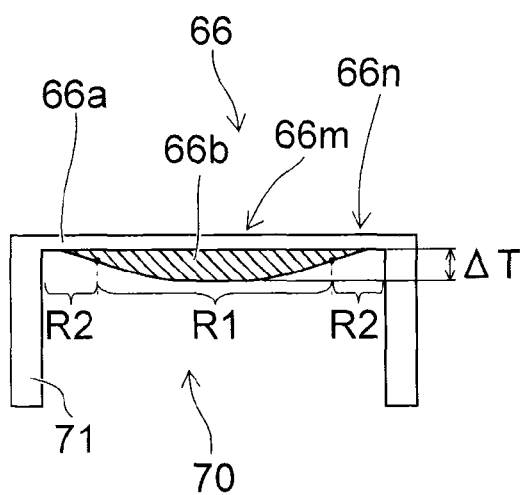
FIGS. 28A to 28C are schematic sectional views illustrating the shape of the film section according to the third embodiment.
Figure 28B:
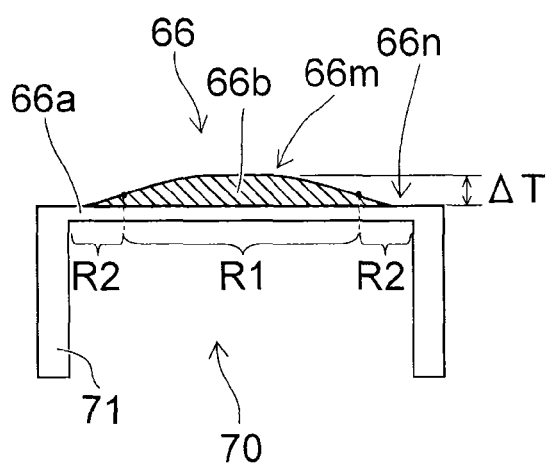
Figure 28C:
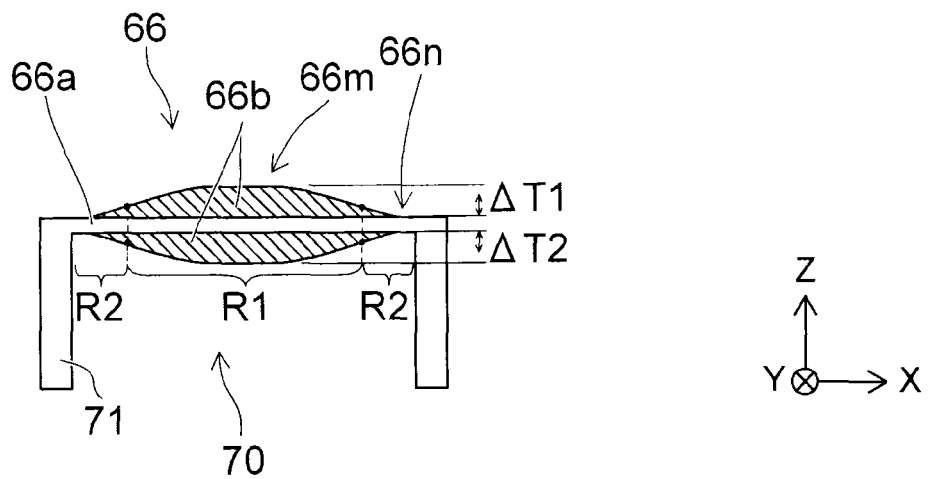

The second film 66b of the film section 66 may be joined to the first film 66a of the film section 66 stepwise as shown in FIGS. 26A to 26C. Alternatively, the second film 66b of the film section 66 may be joined to the first film 66a of the film section 66 with a tilt as shown in FIGS. 27A to 27C. Alternatively, the second film 66b of the film section 66 may be joined to the first film 66a of the film section 66 gradually with a curvature as shown in FIGS. 28A to 28C. In the case where the film section 66 is shaped as shown in FIGS. 27A to 28C, the boundary between the first region R1 of the first film 66a and the second region R2 of the first film 66a is defined as the portion (boundary 66c) where the difference $\Delta T$ (the difference $\Delta T1+\Delta T2$ in the case of FIGS. 27C and 28C) between the maximum thickness of the film section 66 and the minimum thickness of the film section 66 is halved.

The thickness of the first film 66a of the film section 66 can be set to e.g. 50 nm or more and 3 µm or less. In this case, preferably, the thickness can be set to 200 nm or more and 1.5 µm or less. In the case where the planar shape of the film section 66 is circular as illustrated in FIG. 25, the diameter dimension of the film section 66 can be set to e.g. 1 µm or more and 600 µm or less. In this case, preferably, the diameter dimension of the film section 66 can be set to 60 µm or more and 600 µm or less. In the case where the planar shape of the film section 66 is square, the length of one side of the film section 66 can be set to e.g. 1 µm or more and 650 µm or less. In this case, preferably, the length of one side of the film section 66 can be set to 50 µm or more and 550 µm or less. In the case where the planar shape of the film section 66 is rectangular, the length of the short side of the film section 66 can be set to e.g. 1 µm or more and 500 µm or less. In this case, preferably, the length of the short side of the film section 66 can be set to 50 µm or more and 400 µm or less.

As in the film section 64 described above with reference to FIGS. 5A to 5D, the film section 66 of the embodiment may be circular, elliptic, square, or rectangular. In the case where the film section 66 is shaped like a square or a rectangle, the corners may be sharp or may be curved. The shape of the first region R1 of the film section 66 is preferably equal to the shape of the film section 66. However, the shape of the first region R1 may be different from the shape of the film section 66.

The function of the pressure sensor 312 of the embodiment is as described above with reference to FIG. 10. Here, the film section 66 of the pressure sensor 312 of the third embodiment corresponds to the film section 64 of the pressure sensor 310 of the first embodiment.

Figure 29:
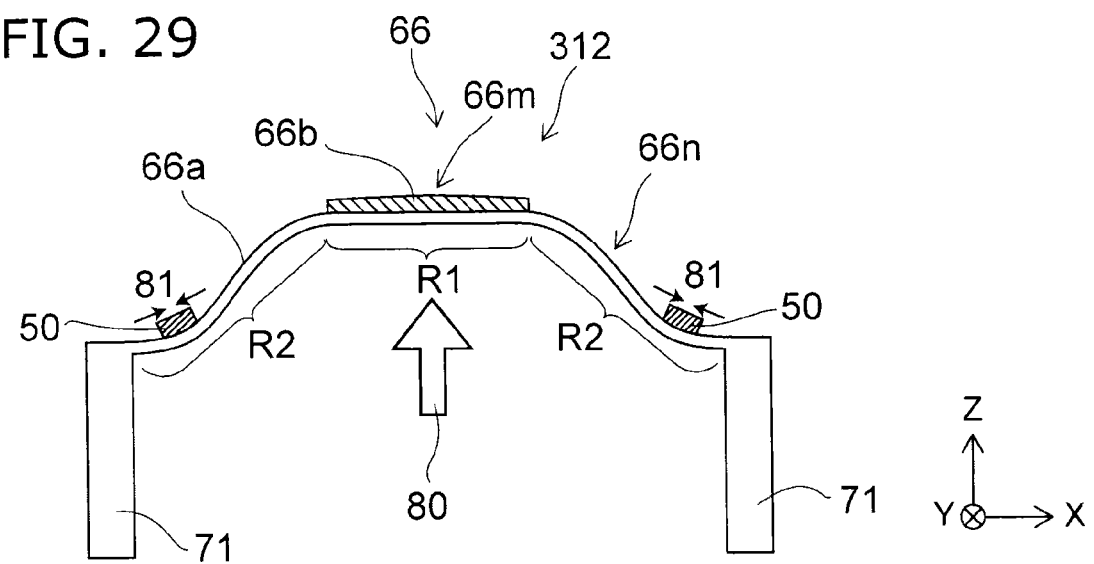
FIG. 29 is a schematic view illustrating the function of the pressure sensor of the third embodiment.

FIG. 29 is a schematic view illustrating the function of the pressure sensor of the third embodiment.

FIG. 29 is a sectional view taken along line A1-A2 of FIG. 25.

The end of the film section 66 is joined to the support section 71. Thus, as shown in FIG. 29, when an external pressure 80 is applied so that the vicinity of the center of the film section 66 is made convex, a compressive stress is applied by the strain 81 to the strain sensing element 50 placed at the film section end. When an external pressure 80 is applied so that the film section 66 is made concave, a tensile stress is applied to the strain sensing element 50 placed at the film section end.

For a larger strain 81, the change of electrical resistance of the strain sensing element 50 is larger. Thus, the sensitivity of the pressure sensor 312 can be enhanced by providing the film section 66 with such a shape that a large strain 81 is generated in response to the external pressure 80. The thickness of the central part 66m of the film section 66 is thicker than the thickness of the peripheral part 66n of the film section 66. The value of the stress remaining in the second film 66b of the film section 66 is larger than the value of the stress remaining in the first film 66a of the film section 66. Alternatively, the Young's modulus of the second film 66b of the film section 66 is larger than the Young's modulus of the first film 66a of the film section 66. Thus, the strain is less likely to occur in the central part 66m and the second film 66b. The strain concentrates near the support section 71 end where the strain sensing element 50 is placed. As a result, the strain 81 is larger than in the case where there is no difference in thickness between the central part 66m of the film section 66 and the peripheral part 66n of the film section 66, or there is no difference in Young's modulus or residual stress between the first film 66a and the second film 66b.

Figure 30A:
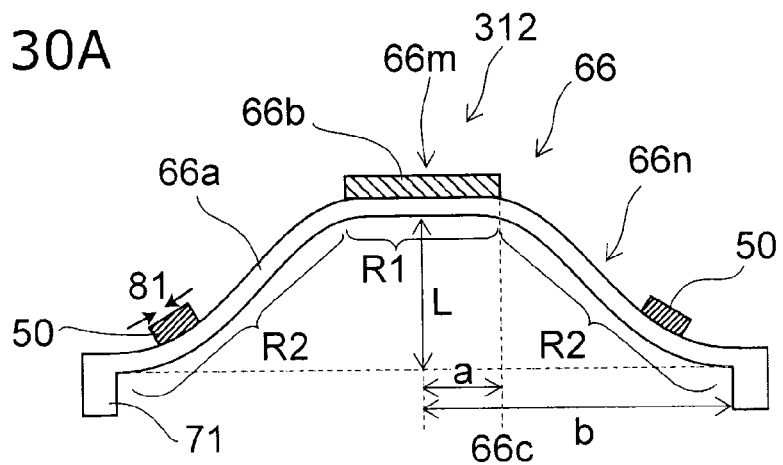
FIGS. 30A and 30B are schematic sectional views showing the displacement of the film when the film section of the pressure sensor of the third embodiment is warped convexly to the outside.
Figure 30B:
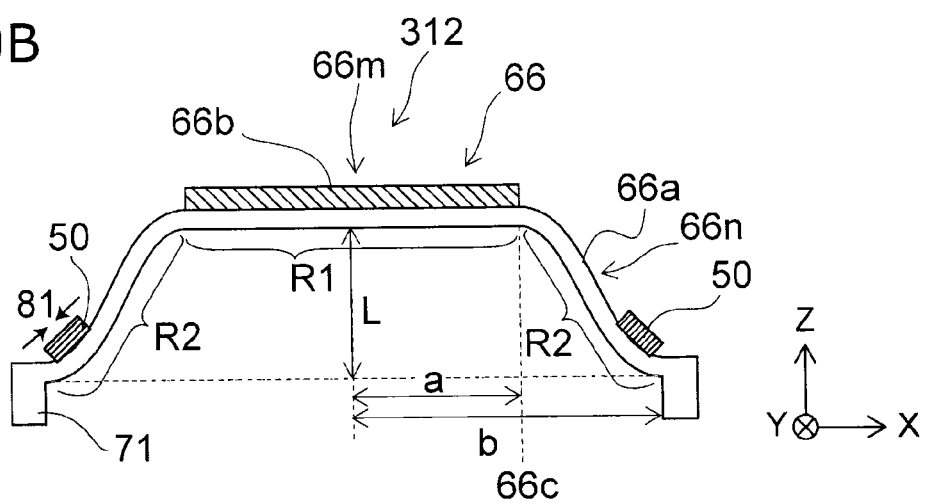

FIGS. 30A and 30B are schematic sectional views showing the displacement of the film when the film section of the pressure sensor of the third embodiment is warped convexly to the outside.

FIGS. 30A and 30B are sectional views taken along line A1-A2 of FIG. 25.

FIG. 30B shows the case where the ratio of the area of the second film 66b of the film section 66 to the total area of the film section 66 is larger than that of FIG. 30A. In other words, FIG. 30B shows the case where the ratio of the area of the first region R1 to the total area of the first film 66a is larger than that of FIG. 30A. In order to simply show that the central part 66m is less prone to strain than the peripheral part 66n, or the second film 66b is less prone to strain than the first film 66a, the central part 66m in the figure is depicted in a flat state without strain. Furthermore, the displacement L of the center of the film section 66 from the initial state is slightly different between FIG. 30A and FIG. 30B. However, the displacement L is equally depicted for simplicity in FIG. 30A and FIG. 30B.

Comparing FIG. 30A with FIG. 30B, the curvature of the film at the position where the strain sensing element 50 is placed (in this example, the second region R2 of the first film 66a) is larger in FIG. 30B. This indicates that the strain 81 generated by the strain of the film section 66 is larger in FIG. 30B than in FIG. 30A. When the external pressure 80 is not applied to the film section 66, the distance from the barycenter of the film section 66 to the boundary 66c between the first region R1 of the first film 66a and the second region R2 of the first film 66a is denoted as distance a. The distance from the barycenter of the film section 66 to the nearest end of the support section 71 is denoted as distance b. The ratio (a/b) of the distance a to the distance b can be set to 0.5 or more and 0.97 or less. In this case, preferably, the ratio can be set to 0.6 or more and 0.95 or less.

The placement position of the strain sensing element 50 of the third embodiment is similar to the placement position of the strain sensing element 50 of the first embodiment. That is, the placement position of the strain sensing element 50 of the third embodiment is as described above with reference to FIGS. 12 and 13. Here, the film section 66 of the pressure sensor 312 of the third embodiment corresponds to the film section 64 of the pressure sensor 310 of the first embodiment.

Manufacturing Process of the Third Embodiment

In view of the features of the shape, the pressure sensor 312 of the third embodiment can be manufactured by the same manufacturing process as the pressure sensor 310 of the first embodiment. Here, the film section 64, the film 64a, and the film 64b of FIGS. 16A to 17D correspond to the film section 66, the film 66a, and the film 66b, respectively.

A combination of the film 66a of the film section 66 and the film 66b of the film section 66 is the film combination of the first region R1 and the second region R2 of the film section 65 of the pressure sensor 311 described above. Here, the film 66b of the film section 66 corresponds to the film of the first region R1 of the film section 65. The film 66a of the film section 66 corresponds to the film of the second region R2 of the film section 65.

Fourth Embodiment

Figure 31:
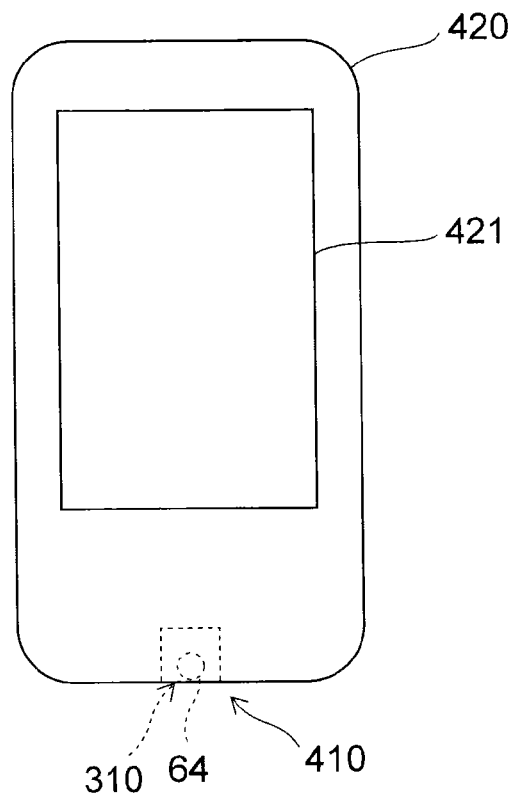
FIG. 31 is a schematic plan view illustrating a microphone according to a fourth embodiment.

FIG. 31 is a schematic plan view illustrating a microphone according to a fourth embodiment.

As shown in FIG. 31, the microphone 410 includes an arbitrary pressure sensor according to the above embodiments (e.g., the pressure sensor 310), or a pressure sensor according to variations thereof. In the following, the microphone 410 including the pressure sensor 310 is illustrated as an example.

The microphone 410 is incorporated in the end part of a personal digital assistant 420. The film section 64 of the pressure sensor 310 provided in the microphone 410 can be made substantially parallel to e.g. the surface of the personal digital assistant 420 on which the display section 421 is provided. The placement of the film section 64 is not limited to that illustrated, but can be appropriately changed.

The microphone 410 includes the pressure sensor 310 and the like. Thus, the microphone 410 can be provided with high sensitivity to a wide range of frequencies.

The embodiment is illustrated with reference to the case where the microphone 410 is incorporated in the personal digital assistant 420. However, the embodiment is not limited thereto. The microphone 410 can be incorporated in e.g. an IC recorder or a pin microphone.

Fifth Embodiment

The embodiment relates to an acoustic microphone based on the pressure sensor of the above embodiments.

Figure 32:
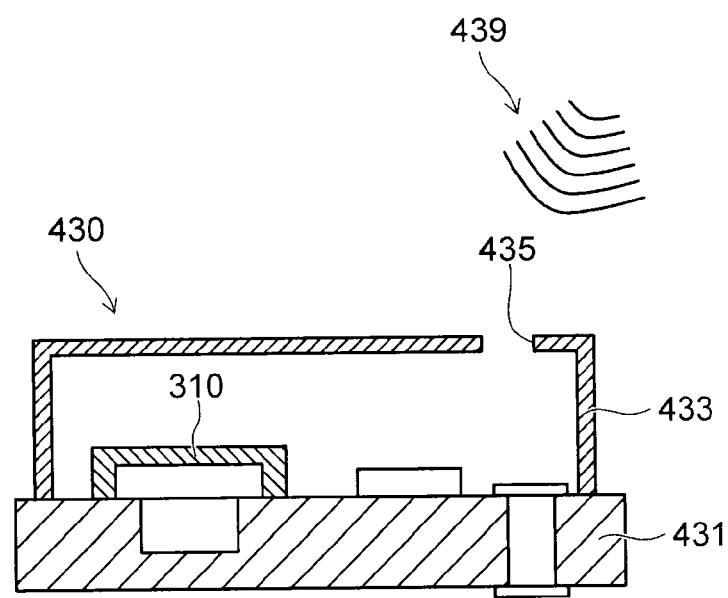
FIG. 32 is a schematic sectional view illustrating an acoustic microphone according to a fifth embodiment.

FIG. 32 is a schematic sectional view illustrating an acoustic microphone according to a fifth embodiment.

The acoustic microphone 430 according to the embodiment includes a printed circuit board 431, a cover 433, and a pressure sensor 310. The printed circuit board 431 includes a circuit such as an amplifier. The cover 433 is provided with an acoustic hole 435. A sound 439 travels into the cover 433 through the acoustic hole 435.

The pressure sensor 310 is one of the pressure sensors described with reference to the above embodiments, and variations thereof.

The acoustic microphone 430 senses the sound pressure. The acoustic microphone 430 with high sensitivity can be obtained by using the pressure sensor 310 with high sensitivity. For instance, the pressure sensor 310 is mounted on the printed circuit board 431. Electrical signal lines are provided thereon. The cover 433 is provided on the printed circuit board 431 so as to cover the pressure sensor 310.

The embodiment can provide an acoustic microphone having high sensitivity.

Sixth Embodiment

The embodiment relates to a blood pressure sensor based on the pressure sensor of the above embodiments.

FIGS. 33A and 33B are schematic views illustrating a blood pressure sensor according to a sixth embodiment.

FIG. 33A is a schematic plan view illustrating the skin of a human above an arterial vessel. FIG. 33B is a sectional view taken along line H1-H2 of FIG. 33A.

In the embodiment, the pressure sensor 310 is applied as a blood pressure sensor 440. This pressure sensor 310 is one of the pressure sensors described with reference to the above embodiments, and variations thereof.

This enables pressure sensing with high sensitivity by a pressure sensor with a small size. The pressure sensor 310 is pressed onto the skin 443 above the arterial vessel 441. Thus, the blood pressure sensor 440 can continuously measure the blood pressure.

This embodiment can provide a blood pressure sensor having high sensitivity.

Seventh Embodiment

The embodiment relates to a touch panel based on the pressure sensor of the above embodiments.

FIG. 34 is a schematic plan view illustrating a touch panel according to a seventh embodiment.

In the embodiment, the pressure sensor 310 is used for a touch panel 450. This pressure sensor 310 is one of the pressure sensors described with reference to the above embodiments, and variations thereof. In the touch panel 450, the pressure sensor 310 is installed in at least one of the inside and outside of a display.

For instance, the touch panel 450 includes a plurality of first wirings 451, a plurality of second wirings 452, a plurality of pressure sensors 310, and a control section 453.

In this example, the plurality of first wirings 451 are arranged along the Y-axis direction. Each of the plurality of first wirings 451 extends along the X-axis direction. The plurality of second wirings 452 are arranged along the X-axis direction. Each of the plurality of second wirings 452 extends along the Y-axis direction.

Each of the plurality of pressure sensors 310 is provided at the crossing part of one of the plurality of first wirings 451 and one of the plurality of second wirings 452. One pressure sensor 310 constitutes one detection element 310e for detection. Here, the crossing part includes the crossing position of the first wiring 451 and the second wiring 452, and a region therearound.

One end 351 of each of the plurality of pressure sensors 310 is connected to one of the plurality of first wirings 451. The other end 352 of each of the plurality of pressure sensors 310 is connected to one of the plurality of second wirings 452.

The control section 453 is connected to the plurality of first wirings 451 and the plurality of second wirings 452.

For instance, the control section 453 includes a first wiring circuit 453a connected to the plurality of first wirings 451, a second wiring circuit 453b connected to the plurality of second wirings 452, and a control circuit 455 connected to the first wiring circuit 453a and the second wiring circuit 453b.

The pressure sensor 310 enables high sensitivity pressure sensing with a small size. Thus, a high definition touch panel can be realized.

Besides the above applications, the pressure sensor according to the above embodiments is applicable to various pressure sensor devices such as a barometric pressure sensor and a tire pressure sensor.

The embodiments can provide a strain sensing element, a pressure sensor, a microphone, a blood pressure sensor, and a touch panel having high sensitivity.

The embodiments of the invention have been described above with reference to examples. However, the invention is not limited to these examples. For instance, any specific configurations of various components such as the film section, strain sensing element, first magnetic layer, second magnetic layer, intermediate layer, and bias layer included in the strain sensing element, the pressure sensor, the microphone, the blood pressure sensor, and the touch panel are encompassed within the scope of the invention as long as those skilled in the art can similarly practice the invention and achieve similar effects by suitably selecting such configurations from conventionally known ones.

Further, combinations of two or more components of the respective specific examples in a technically allowable range are also included in the scope of the invention in a range without departing from the spirit of the invention.

In addition, all strain sensing elements, pressure sensors, microphones, blood pressure sensors and touch panels obtainable by an appropriate design modification by those skilled in the art based on the strain sensing elements, the pressure sensors, the microphones, the blood pressure sensors and the touch panels described above as the embodiments of the invention also are included in the scope of the invention in a range without departing from the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Other Embodiments

The embodiments of the invention have been described above. However, the invention can be practiced also in the aspects as described below.

Aspect 1

A pressure sensor comprising:
a support section;
a film section supported by the support section, being deformable, and including a first film and a second film, the first film including a first region located in a central part and a second region located in a peripheral part around the first region, and the second film being provided on the first region; and
a strain sensing element provided on part of the second region and including:
  a first magnetic layer with a magnetization changing in response to deformation of the second region;
  a second magnetic layer; and
  an intermediate layer provided between the first magnetic layer and the second magnetic layer.

Aspect 2

The pressure sensor according to aspect 1, wherein the second film is shaped integrally with the first film.

Aspect 3

The pressure sensor according to aspect 1, wherein ratio (a/b) of sum (a) of film thickness of the first film and film thickness of the second film in the first region to film thickness (b) of the second region is 1.1 or more and 4 or less.

Aspect 4

The pressure sensor according to aspect 1, wherein material of the second film is different from material of the first film.

Aspect 5

The pressure sensor according to aspect 1, wherein Young's modulus of the second film is larger than Young's modulus of the first film.

Aspect 6

The pressure sensor according to aspect 1, wherein value of stress remaining in the second film is relatively more tensile than value of stress remaining in the first film.

Aspect 7

The pressure sensor according to any one of aspects 1 to 6, wherein the first film includes at least one material selected from the group consisting of semiconductor, insulator, oxide, and nitride.

Aspect 8

The pressure sensor according to any one of aspects 1 to 7, wherein the first film includes at least one material selected from the group consisting of silicon, silicon oxide, and silicon nitride.

Aspect 9

The pressure sensor according to any one of aspects 1 to 6, wherein the second film includes a metal.

Aspect 10

The pressure sensor according to any one of aspects 1 to 6 and 9, wherein the second film includes at least one metal selected from the group consisting of gold (Au), silver (Ag), copper (Cu), aluminum (Al), and molybdenum (Mo).

Aspect 11

The pressure sensor according to any one of aspects 1 to 6, wherein the second film includes amorphous silicon.

Aspect 12

The pressure sensor according to any one of aspects 1 to 6, wherein the second film includes a film in which an impurity is added to the first film.

Aspect 13

The pressure sensor according to any one of aspects 1 to 6 and 12, wherein the first film includes silicon (Si), and the second film includes silicon (Si) added with at least one impurity selected from the group consisting of hydrogen (H), helium (He), lithium (Li), beryllium (Be), boron (B), carbon (C), nitrogen (N), oxygen (O), fluorine (F), neon (Ne), sodium (Na), magnesium (Mg), and aluminum (Al).

Aspect 14

The pressure sensor according to any one of aspects 1 to 6, wherein the first film includes a film in which an impurity is added to the second film.

Aspect 15

The pressure sensor according to any one of aspects 1 to 6 and 14, wherein the second film includes silicon (Si), and the first film includes silicon (Si) added with at least one impurity selected from the group consisting of phosphorus (P), sulfur (S), chlorine (Cl), argon (Ar), potassium (K), calcium (Ca), scandium (Sc), titanium (Ti), vanadium (V), chromium (Cr), manganese (Mn), iron (Fe), cobalt (Co), nickel (Ni), copper (Cu), gallium (Ga), germanium (Ge), and arsenic (As).

Aspect 16

The pressure sensor according to any one of aspects 1 to 6, wherein the first film includes silicon (Si) added with at least one impurity selected from the group consisting of phosphorus (P), sulfur (S), chlorine (Cl), argon (Ar), potassium (K), calcium (Ca), scandium (Sc), titanium (Ti), vanadium (V), chromium (Cr), manganese (Mn), iron (Fe), cobalt (Co), nickel (Ni), copper (Cu), gallium (Ga), germanium (Ge), and arsenic (As), and the second film includes silicon (Si) added with at least one impurity selected from the group consisting of hydrogen (H), helium (He), lithium (Li), beryllium (Be), boron (B), carbon (C), nitrogen (N), oxygen (O), fluorine (F), neon (Ne), sodium (Na), magnesium (Mg), and aluminum (Al).

Aspect 17

The pressure sensor according to any one of aspects 1 to 6, wherein the first film and the second film include silicon nitride (Si—N), and content of nitrogen contained in the second film is lower than content of nitrogen contained in the first film.

Aspect 18

A pressure sensor comprising:
a support section;
a film section supported by the support section, being deformable, and including a first region located in a central part and a second region located in a peripheral part around the first region, material of the first region being different from material of the second region; and
a strain sensing element provided on part of the second region and including:
  a first magnetic layer with a magnetization changing in response to deformation of the second region;
  a second magnetic layer; and
  an intermediate layer provided between the first magnetic layer and the second magnetic layer.

Aspect 19

A pressure sensor comprising:
a support section;
a film section supported by the support section, being deformable, and including a first region located in a central part and a second region located in a peripheral part around the first region, Young's modulus of the first region being larger than Young's modulus of the second region; and
a strain sensing element provided on part of the second region and including:
  a first magnetic layer with a magnetization changing in response to deformation of the second region;
  a second magnetic layer; and
  an intermediate layer provided between the first magnetic layer and the second magnetic layer.

Aspect 20

A pressure sensor comprising:
a support section;
a film section supported by the support section, being deformable, and including a first region located in a central part and a second region located in a peripheral part around the first region, value of stress remaining in the first region being relatively more tensile than value of stress remaining in the second region; and
a strain sensing element provided on part of the second region and including:
  a first magnetic layer with a magnetization changing in response to deformation of the second region;
  a second magnetic layer; and
  an intermediate layer provided between the first magnetic layer and the second magnetic layer.

Aspect 21

The pressure sensor according to any one of aspects 1 to 20, wherein ratio (c/d) of distance (c) from center of the first region to boundary between the first region and the second region versus distance (d) from the center of the first region to a nearest one of the support sections is 0.5 or more and 0.97 or less.

Aspect 22

The pressure sensor according to any one of aspects 1 to 21, wherein the strain sensing element is placed between a center point of a straight line connecting a boundary between the first region and the second region to an end part of the support section having nearest distance from the boundary and the end part.

Aspect 23

The pressure sensor according to any one of aspects 18 to 22, wherein the film section of the second region includes at least one material selected from the group consisting of semiconductor, insulator, oxide, and nitride.

Aspect 24

The pressure sensor according to any one of aspects 18 to 23, wherein the film section of the second region includes at least one material selected from the group consisting of silicon, silicon oxide, and silicon nitride.

Aspect 25

The pressure sensor according to any one of aspects 18 to 22, wherein the film section of the first region includes a metal.

Aspect 26

The pressure sensor according to any one of aspects 18 to 22 and 25, wherein the film section of the first region includes at least one metal selected from the group consisting of gold (Au), silver (Ag), copper (Cu), aluminum (Al), and molybdenum (Mo).

Aspect 27

The pressure sensor according to any one of aspects 18 to 22, wherein the film section of the first region includes amorphous silicon.

Aspect 28

The pressure sensor according to any one of aspects 18 to 22, wherein the film section of the first region includes a material in which an impurity is added to a material constituting the film section of the second region.

Aspect 29

The pressure sensor according to any one of aspects 18 to 22 and 28, wherein the film section of the second region includes silicon (Si), and the film section of the first region includes silicon (Si) added with at least one impurity selected from the group consisting of hydrogen (H), helium (He), lithium (Li), beryllium (Be), boron (B), carbon (C), nitrogen (N), oxygen (O), fluorine (F), neon (Ne), sodium (Na), magnesium (Mg), and aluminum (Al).

Aspect 30

The pressure sensor according to any one of aspects 18 to 22, wherein the film section of the second region includes a material in which an impurity is added to a material constituting the film section of the first region.

Aspect 31

The pressure sensor according to any one of aspects 18 to 22 and 30, wherein the film section of the first region includes silicon (Si), and the film section of the second region includes silicon (Si) added with at least one impurity selected from the group consisting of phosphorus (P), sulfur (S), chlorine (Cl), argon (Ar), potassium (K), calcium (Ca), scandium (Sc), titanium (Ti), vanadium (V), chromium (Cr), manganese (Mn), iron (Fe), cobalt (Co), nickel (Ni), copper (Cu), gallium (Ga), germanium (Ge), and arsenic (As).

Aspect 32

The pressure sensor according to any one of aspects 18 to 22, wherein the film section of the first region includes silicon (Si) added with at least one impurity selected from the group consisting of hydrogen (H), helium (He), lithium (Li), beryllium (Be), boron (B), carbon (C), nitrogen (N), oxygen (O), fluorine (F), neon (Ne), sodium (Na), magnesium (Mg), and aluminum (Al), and the film section of the second region includes silicon (Si) added with at least one impurity selected from the group consisting of phosphorus (P), sulfur (S), chlorine (Cl), argon (Ar), potassium (K), calcium (Ca), scandium (Sc), titanium (Ti), vanadium (V), chromium (Cr), manganese (Mn), iron (Fe), cobalt (Co), nickel (Ni), copper (Cu), gallium (Ga), germanium (Ge), and arsenic (As).

Aspect 33

The pressure sensor according to any one of aspects 18 to 22, wherein the film section of the first region and the film section of the second region include silicon nitride (Si—N), and content of nitrogen contained in the film section of the first region is lower than content of nitrogen contained in the film section of the second region.

Aspect 34

The pressure sensor according to any one of aspects 1 to 33, wherein the strain sensing element further includes an electrode provided between the first magnetic layer and the film section.

Aspect 35

The pressure sensor according to any one of aspects 1 to 34, wherein the strain sensing element is provided in a plurality.

Aspect 36

A microphone comprising the pressure sensor according to any one of aspects 1 to 34.

Aspect 37

A blood pressure sensor comprising the pressure sensor according to any one of aspects 1 to 34.

Aspect 38

A touch panel comprising the pressure sensor according to any one of aspects 1 to 34.

The invention claimed is:
1. A pressure sensor comprising:
a support section;
a film section supported by the support section, being deformable, and including a first film and a second film, the first film including a first region located in a central part and a second region located in a peripheral part around the first region, and the second film being provided on the first region; and
a strain sensing element provided on part of the second region and including:
a first magnetic layer with a magnetization changing in response to deformation of the second region;
a second magnetic layer; and
an intermediate layer provided between the first magnetic layer and the second magnetic layer.
2. The sensor according to claim 1, wherein the second film is shaped integrally with the first film.
3. The sensor according to claim 1, wherein material of the second film is different from material of the first film.
4. The sensor according to claim 1, wherein Young's modulus of the second film is larger than Young's modulus of the first film.
5. The sensor according to claim 1, wherein value of stress remaining in the second film is relatively more tensile than value of stress remaining in the first film.
6. The sensor according to claim 1, wherein the strain sensing element further includes an electrode provided between the first magnetic layer and the film section.
7. The sensor according to claim 1, wherein the strain sensing element is placed between a center point of a straight line connecting a boundary between the first region and the second region to an end part of the support section having nearest distance from the boundary and the end part.
8. The sensor according to claim 1, wherein the strain sensing element is provided in a plurality.
9. The sensor according to claim 1, wherein ratio (a/b) of sum (a) of film thickness of the first film and film thickness of the second film in the first region to film thickness (b) of the second region is 1.1 or more and 4 or less.
10. The sensor according to claim 1, wherein the first film includes at least one material selected from the group consisting of semiconductor, insulator, oxide, and nitride.
11. The sensor according to claim 1, wherein the first film includes at least one material selected from the group consisting of silicon, silicon oxide, and silicon nitride.
12. The sensor according to claim 1, wherein the second film includes a metal.
13. The sensor according to claim 1, wherein the first film and the second film include silicon nitride (Si—N), and content of nitrogen contained in the second film is lower than content of nitrogen contained in the first film.
14. The sensor according to claim 1, wherein ratio (c/d) of distance (c) from center of the first region to boundary between the first region and the second region versus distance (d) from the center of the first region to a nearest one of the support sections is 0.5 or more and 0.97 or less.
15. The sensor according to claim 1, wherein the second film includes at least one metal selected from the group consisting of gold (Au), silver (Ag), copper (Cu), aluminum (Al), and molybdenum (Mo).
16. The sensor according to claim 1, wherein the second film includes amorphous silicon.
17. The sensor according to claim 1, wherein the second film includes a film in which an impurity is added to the first film.

18. A pressure sensor comprising:

a support section;

a film section supported by the support section, being deformable, and including a first region located in a central part and a second region located in a peripheral part around the first region, material of the first region being different from material of the second region; and a strain sensing element provided on part of the second region and including:

- a first magnetic layer with a magnetization changing in response to deformation of the second region;
- a second magnetic layer; and
- an intermediate layer provided between the first magnetic layer and the second magnetic layer.

19. A pressure sensor comprising:

a support section;

a film section supported by the support section, being deformable, and including a first region located in a central part and a second region located in a peripheral part around the first region, Young's modulus of the first region being larger than Young's modulus of the second region; and a strain sensing element provided on part of the second region and including:

- a first magnetic layer with a magnetization changing in response to deformation of the second region;
- a second magnetic layer; and
- an intermediate layer provided between the first magnetic layer and the second magnetic layer.

20. A pressure sensor comprising:

a support section;

a film section supported by the support section, being deformable, and including a first region located in a central part and a second region located in a peripheral part around the first region, value of stress remaining in the first region being relatively more tensile than value of stress remaining in the second region; and a strain sensing element provided on part of the second region and including:

- a first magnetic layer with a magnetization changing in response to deformation of the second region;
- a second magnetic layer; and
- an intermediate layer provided between the first magnetic layer and the second magnetic layer.

* * * * *